United States Patent
Le et al.

(10) Patent No.: US 12,106,791 B2
(45) Date of Patent: Oct. 1, 2024

(54) DOPED BiSb (012) OR UNDOPED BiSb (001) TOPOLOGICAL INSULATOR WITH GeNiFe BUFFER LAYER AND/OR INTERLAYER FOR SOT BASED SENSOR, MEMORY, AND STORAGE DEVICES

(71) Applicant: Western Digital Technologies, Inc., San Jose, CA (US)

(72) Inventors: Quang Le, San Jose, CA (US); Brian R. York, San Jose, CA (US); Cherngye Hwang, San Jose, CA (US); Xiaoyong Liu, San Jose, CA (US); Michael A. Gribelyuk, San Jose, CA (US); Xiaoyu Xu, San Jose, CA (US); Susumu Okamura, San Jose, CA (US); Kuok San Ho, Emerald Hills, CA (US); Hisashi Takano, San Jose, CA (US); Randy G. Simmons, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 215 days.

(21) Appl. No.: 17/854,785

(22) Filed: Jun. 30, 2022

(65) Prior Publication Data

US 2024/0005973 A1    Jan. 4, 2024

(51) Int. Cl.
*G11C 11/16* (2006.01)
*G11B 5/39* (2006.01)
(Continued)

(52) U.S. Cl.
CPC .......... *G11C 11/161* (2013.01); *G11B 5/3906* (2013.01); *H10B 61/00* (2023.02);
(Continued)

(58) Field of Classification Search
CPC ........ G11C 11/161; G11C 11/16; H01B 61/00
(Continued)

(56) References Cited

U.S. PATENT DOCUMENTS

2008/0188681 A1 *  8/2008  Liang ................. B01J 37/03
                                                 423/306
2020/0035910 A1    1/2020  Li et al.
(Continued)

*Primary Examiner* — Muna A Techane
(74) *Attorney, Agent, or Firm* — PATTERSON + SHERIDAN, LLP

(57) ABSTRACT

The present disclosure generally relates to spin-orbit torque (SOT) devices comprising a bismuth antimony (BiSb) layer. The SOT devices further comprise one or more $Ge_xNiFe$ layers, where at least one $Ge_xNiFe$ layer is disposed in contact with the BiSb layer. The $Ge_xNiFe$ layer has a thickness less than or equal to about 15 Å when used as an interlayer on top of the BiSb layer or less than or equal to 40 Å when used as a buffer layer underneath the BiSb. When the BiSb layer is doped with a dopant comprising a gas, a metal, a non-metal, or a ceramic material, the $Ge_xNiFe$ layer promotes the BiSb layer to have a (012) orientation. When the BiSb layer is undoped, the $Ge_xNiFe$ layer promotes the BiSb layer to have a (001) orientation. Utilizing the $Ge_xNiFe$ layer allows the crystal orientation of the BiSb layer to be selected.

34 Claims, 15 Drawing Sheets

(51) Int. Cl.
*H10B 61/00* (2023.01)
*H10N 50/10* (2023.01)
*H10N 50/85* (2023.01)
*H10N 52/00* (2023.01)
*H10N 52/80* (2023.01)

(52) U.S. Cl.
CPC ............ *H10N 50/10* (2023.02); *H10N 50/85* (2023.02); *H10N 52/00* (2023.02); *H10N 52/80* (2023.02)

(58) Field of Classification Search
USPC .......................................................... 365/201
See application file for complete search history.

(56) References Cited

U.S. PATENT DOCUMENTS

| | | | |
|---|---|---|---|
| 2021/0005235 A1 | 1/2021 | Min et al. | |
| 2021/0249038 A1 | 8/2021 | Le et al. | |
| 2021/0336127 A1* | 10/2021 | Le | H01F 10/3254 |
| 2021/0408370 A1 | 12/2021 | York et al. | |
| 2022/0060149 A1 | 2/2022 | Pham et al. | |
| 2022/0324063 A1* | 10/2022 | Choudhury | B23K 35/262 |

* cited by examiner

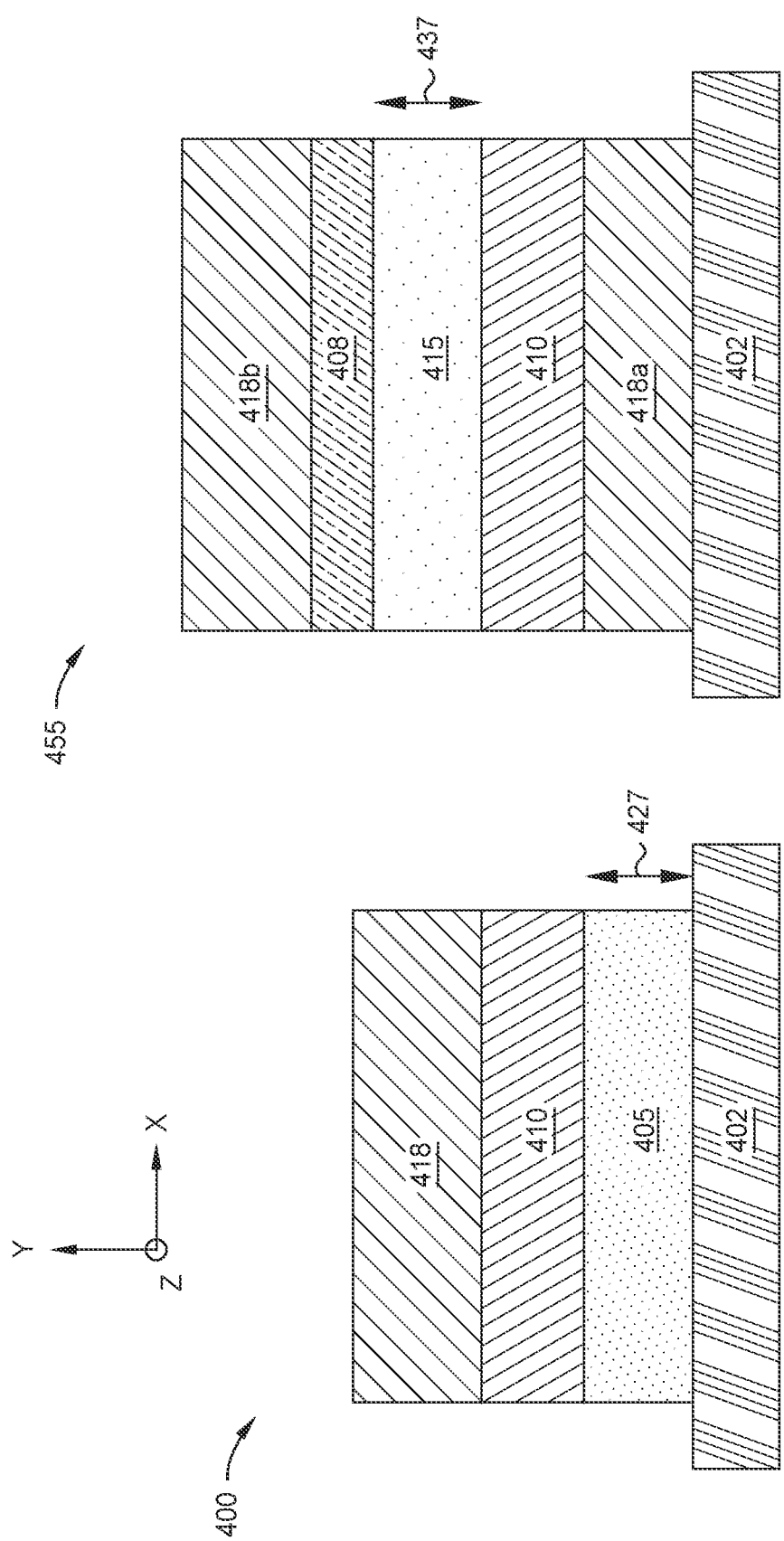

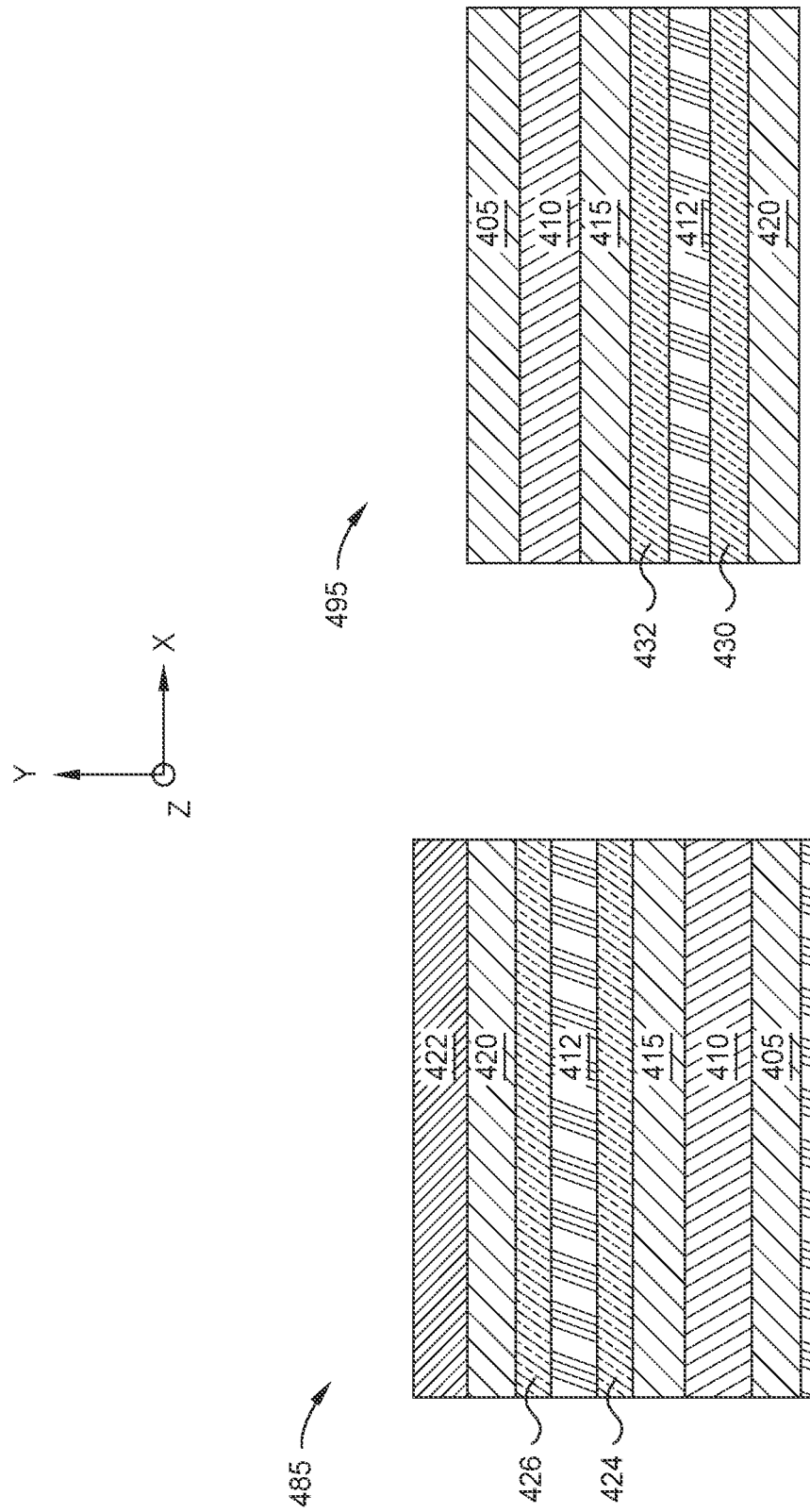

DOPED BiSb (012) OR UNDOPED BiSb (001) TOPOLOGICAL INSULATOR WITH GeNiFe BUFFER LAYER AND/OR INTERLAYER FOR SOT BASED SENSOR, MEMORY, AND STORAGE DEVICES

BACKGROUND OF THE DISCLOSURE

Field of the Disclosure

Embodiments of the present disclosure generally relate to spin-orbit torque (SOT) device comprising a bismuth antimony (BiSb) layer.

Description of the Related Art

BiSb layers are narrow band gap topological insulators with both giant spin Hall effect and high electrical conductivity. BiSb is a material that has been proposed in various spin-orbit torque (SOT) device applications, such as for a spin Hall layer for magnetoresistive random access memory (MRAM) devices and energy-assisted magnetic recording (EAMR) write heads.

However, utilizing BiSb materials in commercial SOT applications can present several obstacles. For example, BiSb materials have low melting points, large grain sizes, significant Sb migration issues upon thermal annealing due to its film roughness, difficulty maintaining a desired (012) or (001) orientation for maximum spin Hall effect, and are generally soft and easily damaged by ion milling.

Therefore, there is a need for an improved SOT device utilizing BiSb layer(s) having a desired crystal orientation and a high signal-to-noise ratio.

SUMMARY OF THE DISCLOSURE

The present disclosure generally relates to spin-orbit torque (SOT) devices comprising a bismuth antimony (BiSb) layer. The SOT devices further comprise one or more Germanium Nickel Iron (GeNiFe) layers, where at least one GeNiFe layer is disposed in contact with the BiSb layer. The GeNiFe layer has a thickness less than or equal to about 15 Å when used as an interlayer on top of the BiSb layer or less than or equal to about 40 Å when used as a buffer layer. The GeNiFe layer can be single alloy layer or comprised of a thin Ge layer deposited onto a thin NiFe layer where the Ge layer is in contact with the BiSb layer, or a NiFe layer deposited onto a Ge layer where the NiFe layer is next to the BiSb Layer. A thin bilayer of Ge on NiFe and a thin bilayer of NiFe on Ge form a single graded GeNiFe alloy layer after deposition and at RT (room temperature). The composition gradient of GeNiFe in a thin bilayer can be varied depending on the order and thicknesses of the deposition of Ge or NiFe which can be useful in optimizing the BiSb texture or in controlling Bi,Sb migration. When the BiSb layer is doped with a dopant comprising a gas, a metal, a non-metal, or a ceramic material, the GeNiFe layer promotes the BiSb layer to have a (012) orientation. When the BiSb layer is undoped, the GeNiFe layer promotes the BiSb layer to have a (001) orientation. Utilizing the GeNiFe layer allows the crystal orientation of the BiSb layer to be selected.

In one embodiment, a SOT device comprises a first Germanium Nickel Iron ($Ge_xNiFe$) comprising layer, where x is numeral between 44 and 90, and a BiSb layer disposed over the first $Ge_xNiFe$ comprising layer, wherein: the BiSb layer is doped and has a (012) crystal orientation, or the BiSb layer is undoped and has a (001) crystal orientation.

In another embodiment, a SOT device comprises a first $Ge_xNiFe$ comprising layer, where x is numeral between 44 and 90, the first $Ge_xNiFe$ comprising layer having a thickness less than or equal to about 40 Å, a BiSb layer disposed in contact with the first Ge comprising layer, wherein: the BiSb layer is doped and has a (012) crystal orientation, or the BiSb layer is undoped and has a (001) crystal orientation, a second $Ge_xNiFe$ comprising layer, where x is numeral between 44 and 90, disposed over the BiSb layer, and a ferromagnetic layer disposed over the second $Ge_xNiFe$ comprising layer.

In yet another embodiment, a SOT device comprises a buffer layer comprising $Ge_xNiFe$, the buffer layer having a thickness less than or equal to about 40 Å, a BiSb layer disposed over the buffer layer, wherein: the BiSb layer is doped and has a (012) crystal orientation, or the BiSb layer is undoped and has a (001) crystal orientation, and one or more magnetic layers.

In another embodiment, a SOT device comprises a buffer layer, a BiSb layer disposed on the buffer layer, wherein the BiSb layer is doped and has a (012) crystal orientation, or the BiSb layer is undoped and has a (001) crystal orientation, an interlayer disposed on the BiSb layer, wherein at least one of the buffer layer and the interlayer comprises Germanium Nickel Iron ($Ge_xNiFe$), where x is numeral between 44 and 90, a first barrier layer disposed on the interlayer, a ferromagnetic layer disposed on the first barrier layer, a second barrier layer disposed on the ferromagnetic layer, and a cap layer disposed on the second barrier layer.

In yet another embodiment, a SOT device comprises a seed layer, a first barrier layer disposed on the seed layer, a ferromagnetic layer disposed on the first barrier layer, a second barrier layer disposed on the ferromagnetic layer, an interlayer disposed on the second barrier layer, a BiSb layer disposed on the interlayer, wherein the BiSb layer is doped and has a (012) crystal orientation, or the BiSb layer is undoped and has a (001) crystal orientation, and a buffer layer disposed on the BiSb layer, wherein at least one of the seed layer, the interlayer, and the buffer layer comprises Germanium Nickel Iron ($Ge_xNiFe$), where x is numeral between 44 and 90.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 4A-4E illustrate spin-orbit torque (SOT) devices, according to various embodiments.

To facilitate understanding, identical reference numerals have been used, where possible, to designate identical elements that are common to the Figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to spin-orbit torque (SOT) devices comprising a bismuth antimony (BiSb) layer. The SOT devices further comprise one or more $Ge_xNiFe$ layers, where at least one $Ge_xNiFe$ layer is disposed in contact with the BiSb layer. The $Ge_xNiFe$ layer has a thickness less than or equal to about 15 Å when used as an interlayer on top of the BiSb layer or less than or equal to 40 Å when used as a buffer layer underneath the BiSb. When the BiSb layer is doped with a dopant comprising a gas, a metal, a non-metal, or a ceramic material, the $Ge_xNiFe$ layer promotes the BiSb layer to have a (012) orientation. When the BiSb layer is undoped, the $Ge_xNiFe$ layer promotes the BiSb layer to have a (001) orientation. Utilizing the $Ge_xNiFe$ layer allows the crystal orientation of the BiSb layer to be selected.

A BiSb layer having a (012) orientation or a (001) orientation has a significant spin Hall angle and high electrical conductivity. Therefore, a BiSb layer having a (012) orientation or a (001) orientation can form a SOT device. For example, a BiSb layer having a (012) orientation or a (001) orientation can be used as a spin Hall layer in a spin-orbit torque device in a magnetic recording head, e.g., as part of a write head (MAMR). In another example, a BiSb layer having a (012) orientation or a (001) orientation can be used in nano oscillator devices for reading head applications where a signal is detected in the frequency domain. In another example, a BiSb layer having a (012) orientation or a (001) orientation can be used as a spin Hall electrode layer in an MRAM device. The SOT device can be in a perpendicular stack configuration or an in-plane stack configuration. The SOT device can be utilized in, for example, MAMR writing heads, read head, nano-oscillator based reader, MRAM, artificial intelligence chips, and other applications.

Figure 1:
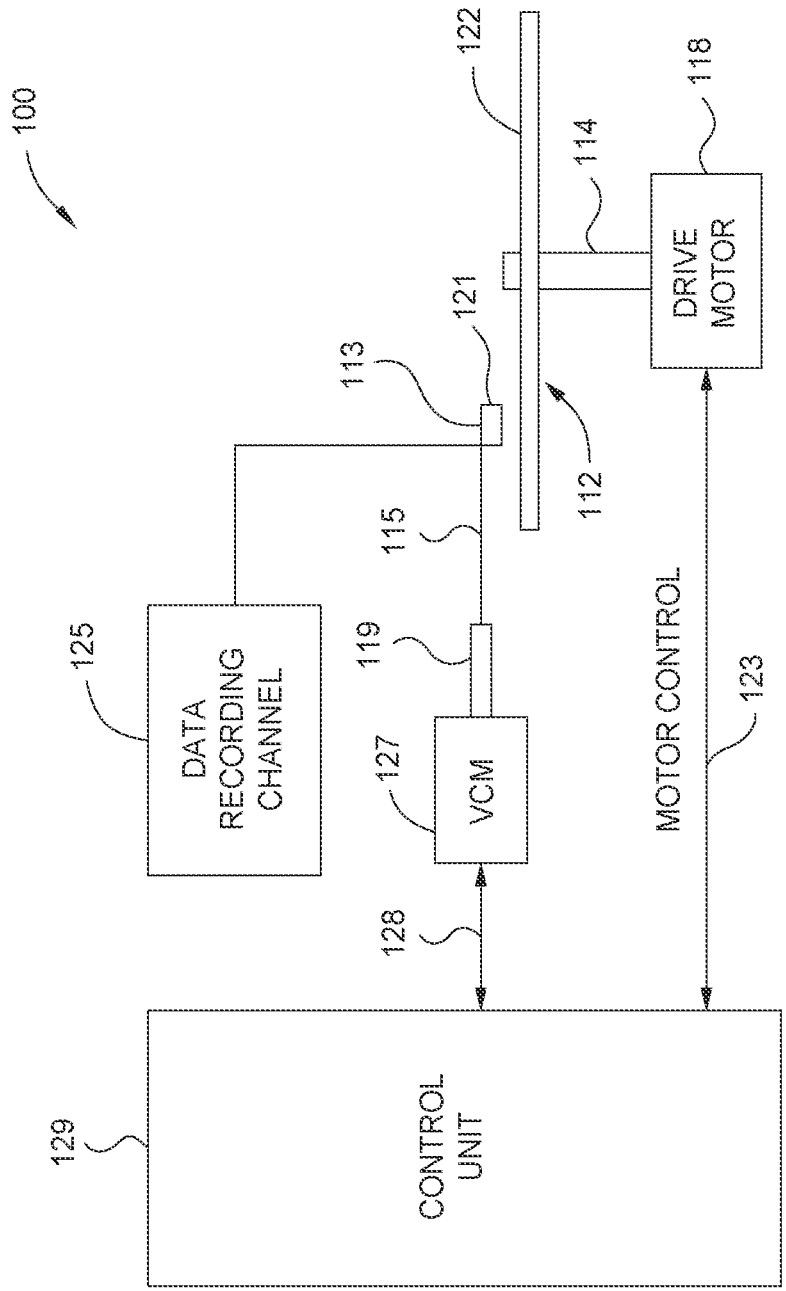
FIG. 1 is a schematic illustration of certain embodiments of a magnetic media drive including a magnetic recording head having a SOT device.

FIG. 1 is a schematic illustration of certain embodiments of a magnetic media drive 100 including a magnetic recording head having a SOT device. Such a magnetic media drive may be a single drive or comprise multiple drives. For the sake of illustration, a single disk drive 100 is shown according to certain embodiments. As shown, at least one rotatable magnetic disk 112 is supported on a spindle 114 and rotated by a drive motor 118. The magnetic recording on each magnetic disk 112 is in the form of any suitable patterns of data tracks, such as annular patterns of concentric data tracks (not shown) on the magnetic disk 112.

Figure 2:
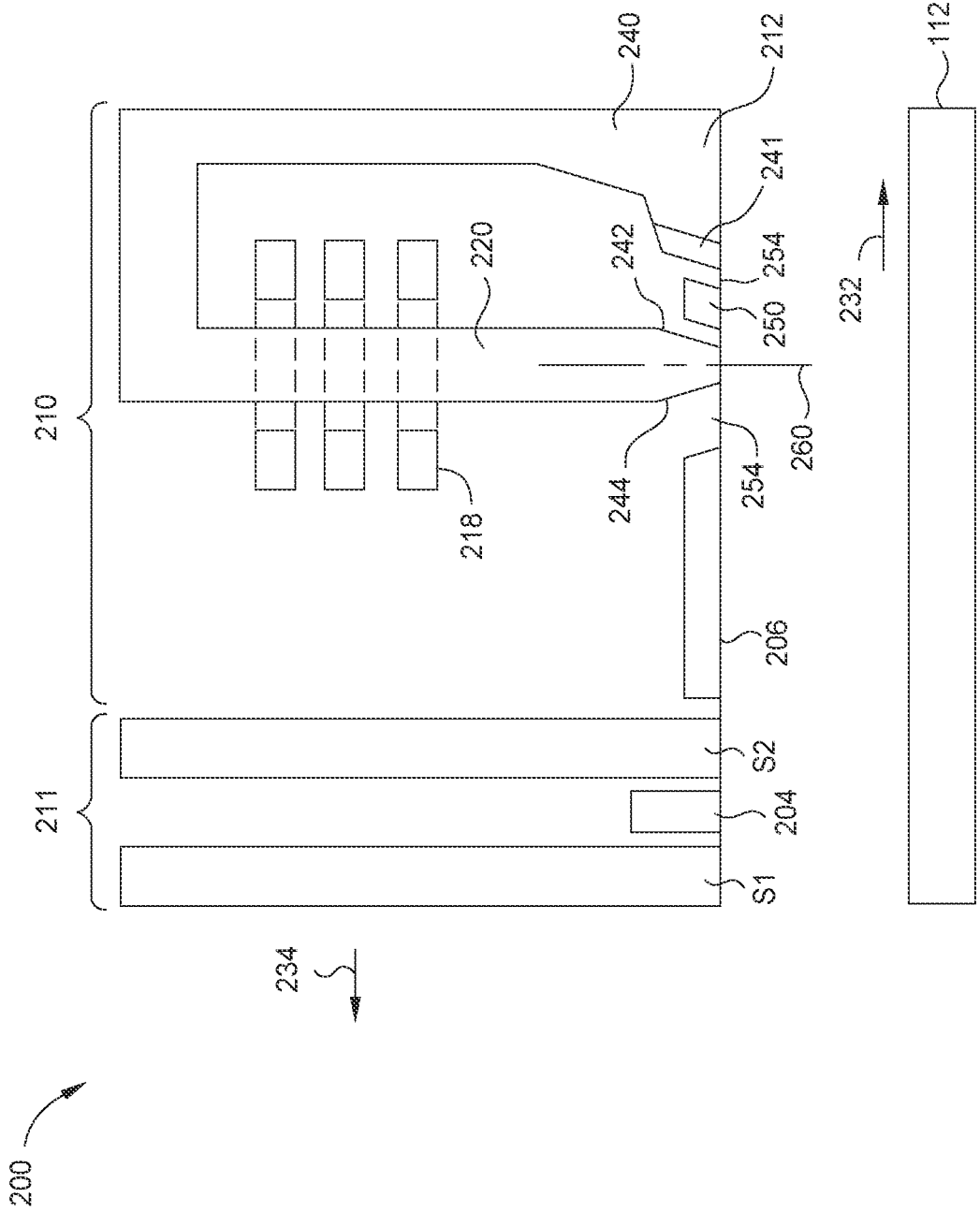
FIG. 2 is a fragmented, cross-sectional side view of certain embodiments of a read/write head having a SOT device.

At least one slider 113 is positioned near the magnetic disk 112, each slider 113 supporting one or more magnetic head assemblies 121 that include a SOT device. As the magnetic disk 112 rotates, the slider 113 moves radially in and out over the disk surface 122 so that the magnetic head assembly 121 may access different tracks of the magnetic disk 112 where desired data are written. Each slider 113 is attached to an actuator arm 119 by way of a suspension 115. The suspension 115 provides a slight spring force which biases the slider 113 toward the disk surface 122. Each actuator arm 119 is attached to an actuator means 127. The actuator means 127 as shown in FIG. 2 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface 122 by a small, substantially constant spacing during normal operation.

The various components of the disk drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads on the assembly 121 by way of recording channel 125.

The above description of a typical magnetic media drive and the accompanying illustration of FIG. 1 are for representation purposes only. It should be apparent that magnetic media drives may contain a large number of media, or disks, and actuators, and each actuator may support a number of sliders. It is to be understood that the embodiments discussed herein are applicable to a data storage device such as a hard disk drive (HDD) as well as a tape drive, such as those conforming to the LTO (Linear Tape Open) standards. As such, any reference in the detailed description to an HDD or tape drive is merely for exemplification purposes and is not intended to limit the disclosure unless explicitly claimed. For example, references to disk media in an HDD embodiment are provided as examples only, and can be substituted with tape media in a tape drive embodiment. Furthermore, reference to or claims directed to magnetic recording devices or data storage devices are intended to include at least both HDD and tape drive unless HDD or tape drive devices are explicitly claimed.

FIG. 2 is a fragmented, cross-sectional side view of certain embodiments of a read/write head 200 having a SOT device. It is noted while an SOT device is shown in both the read head and write head, this is for illustrative purposes only, and an SOT device may be independently integrated into either only the read head or only the write head in various embodiments, or in both the read head and the write head. The read/write head 200 faces a magnetic media 112. The read/write head 200 may correspond to the magnetic head assembly 121 described in FIG. 1. The read/write head 200 includes a media facing surface (MFS) 212, such as a gas bearing surface, facing the disk 112, a write head 210, and a magnetic read head 211. As shown in FIG. 2, the magnetic media 112 moves past the write head 210 in the direction indicated by the arrow 232 and the read/write head 200 moves in the direction indicated by the arrow 234.

In some embodiments, the magnetic read head 211 is a SOT read head that includes an SOT sensing element 204 located between SOT shields S1 and S2. The magnetic fields of the adjacent magnetized regions in the magnetic disk 112 are detectable by the SOT sensing element 204 as the recorded bits. In SOT sensing elements 204 comprising a BiSb layer, such as the SOT devices described in FIGS. 4A-4F, current flows perpendicular to the film plane, and the signal is read out by measuring the voltage in the BiSb layer generated by the inverse spin Hall effect. The SOT device of various embodiments can be incorporated into the read head 211.

The write head 210 includes a main pole 220, a leading shield 206, a trailing shield 240, and a coil 218 that excites the main pole 220. The coil 218 may have a "pancake" structure which winds around a back-contact between the main pole 220 and the trailing shield 240, instead of a "helical" structure shown in FIG. 2. In one embodiment, the write head 210 is a perpendicular magnetic recording (PMR) write head. In other embodiments, the write head 210 may use energy assisted magnetic recording (EAMR) technologies such as microwave assisted magnetic recording (MAMR) and heat assisted magnetic recording (HAMR).

In FIG. 2, a spin orbital torque (SOT) device 250 is shown as part of the write head structure to enable a MAMR recording effect, in one embodiment. As noted above, while an SOT device is shown in FIG. 2 for both the read head and the write head, the SOT devices are not required to be implemented in both. The SOT device 250 is formed in a gap 254 between the main pole 220 and the trailing shield 240. The main pole 220 includes a trailing taper 242 and a leading taper 244. The trailing taper 242 extends from a location recessed from the MFS 212 to the MFS 212. The leading taper 244 extends from a location recessed from the MFS 212 to the MFS 212. The trailing taper 242 and the leading taper 244 may have the same degree of taper, and the degree of taper is measured with respect to a longitudinal axis 260 of the main pole 220. In some embodiments, the main pole 220 does not include the trailing taper 242 and the leading taper 244. Instead, the main pole 220 includes a trailing side (not shown) and a leading side (not shown), and the trailing side and the leading side are substantially parallel. The main pole 220 may be a magnetic material, such as a FeCo alloy. The leading shield 206 and the trailing shield 240 may be a magnetic material, such as a NiFe alloy. In certain embodiments, the trailing shield 240 can include a trailing shield hot seed layer 241. The trailing shield hot seed layer 241 can include a high moment sputter material, such as CoFeN or FeXN, where X includes at least one of Rh, Al, Ta, Zr, and Ti. In certain embodiments, the trailing shield 240 does not include a trailing shield hot seed layer.

In some embodiments, the read head 211 is a spin torque oscillator (STO) read head with an STO oscillator sensing element 204 located between shields S1 and S2. The magnetic fields of the adjacent magnetized regions in the magnetic disk 112 are detectable by the STO sensing element 204 as the recorded bits. The STO sensing elements 204 comprise a BiSb layer, such as an SOT device of FIGS. 4A-4F. The STO reader may be operated in a 2-terminal or a 3-terminal configuration, with an in-plane current flowing inside SOT structure while a small sensing current flows perpendicular to the film plane, and the signal is read out by measuring the frequency of magnetic layer precession. The SOT device of various embodiments can be incorporated into the read head 211.

Figure 3A:
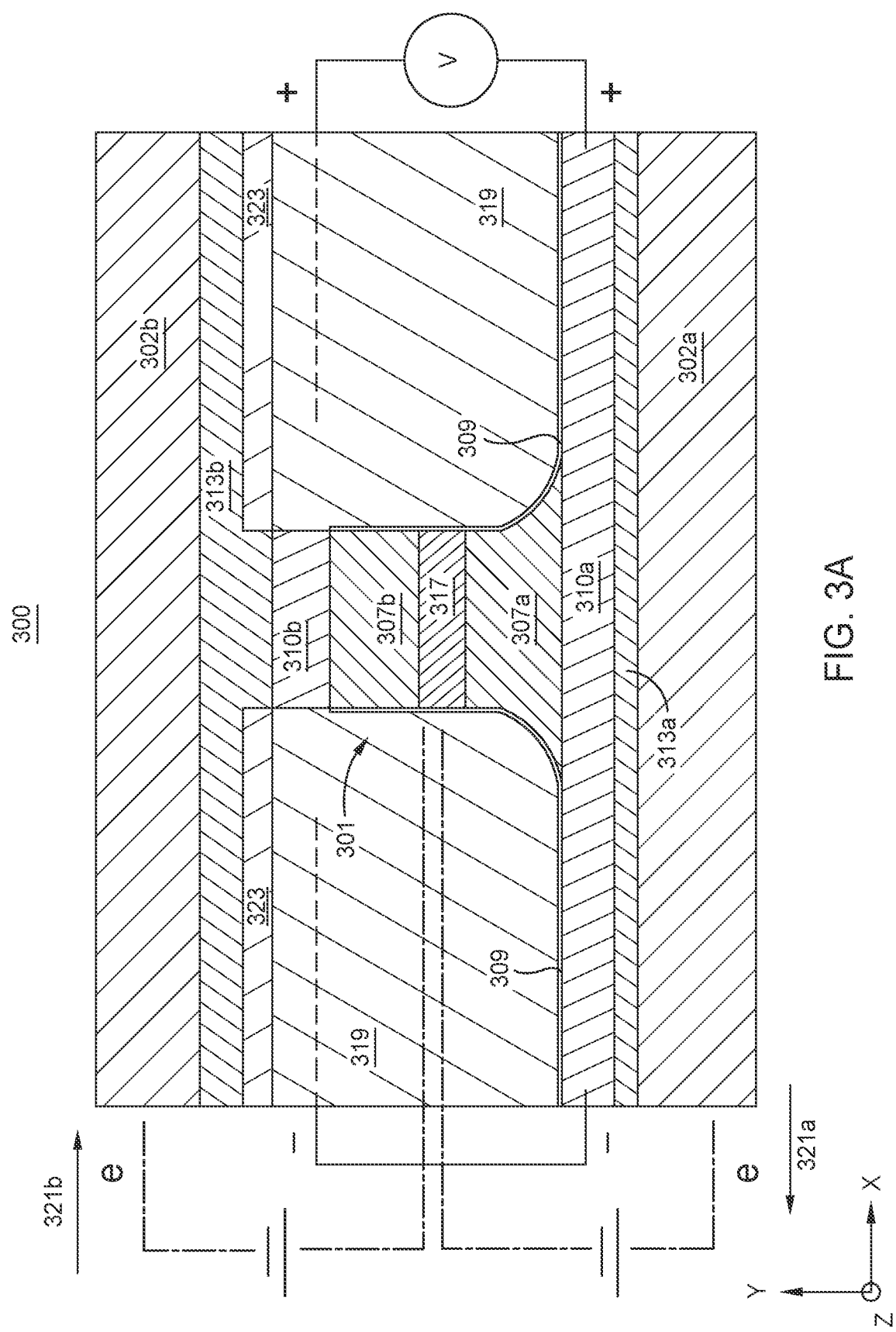
FIGS. 3A-3C illustrate MFS views of read heads comprising an SOT device, according to various embodiments.
Figure 3B:
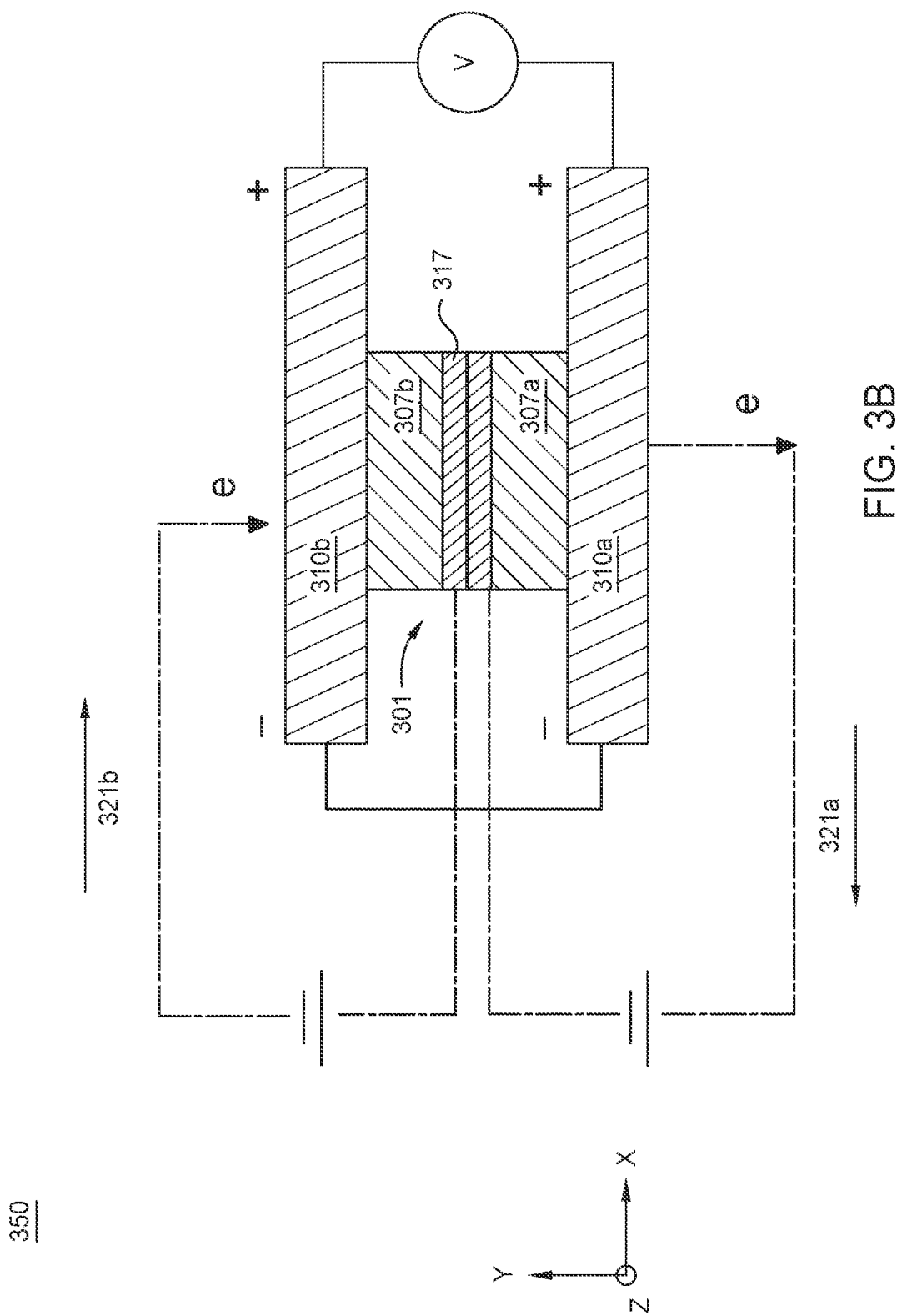
Figure 3C:
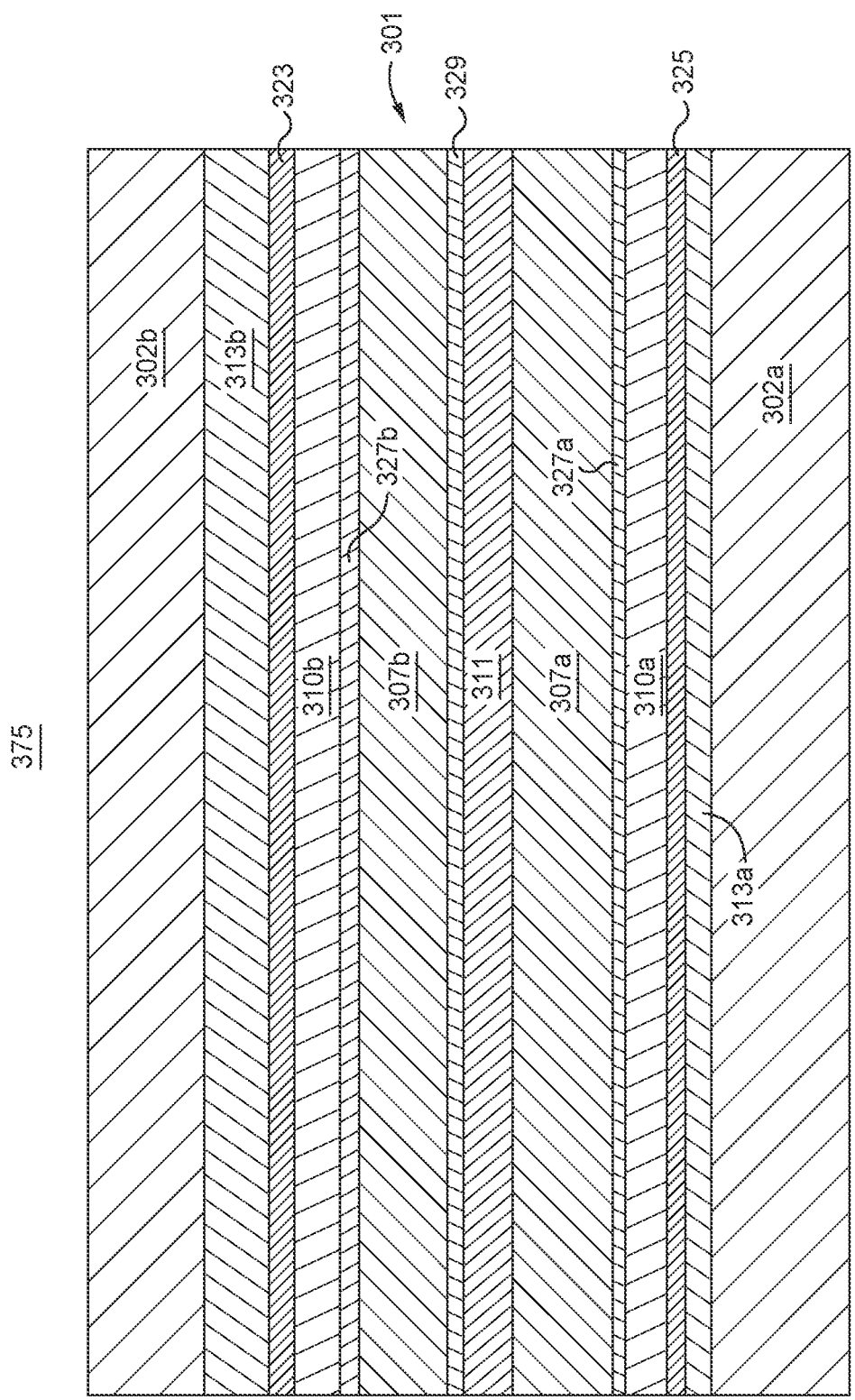

FIGS. 3A-3C illustrate MFS views of read heads 300, 350, 375, respectively, comprising an SOT device 301, according to various embodiments. The read heads 300, 350, 375 may be the read head 211 of FIG. 2. The SOT device 301 of each read head 300, 350, 375 may be the SOT devices 400, 455, 465, 485, 495 of FIGS. 4A-4E. Each read head 300, 350, 375 comprises a SOT device 301 having dual free layers 307a, 307b.

The read head 300 of FIG. 3A comprises a first shield 302a, a first insulation layer 313a disposed on the first shield 302a, a first spin Hall effect layer (SHL) 310a disposed on the insulation layer 313a, a first free layer (FL) 307a disposed on the first SHL 310a, a gap layer 317 disposed on the first FL 307a, a second FL 307b disposed on the gap layer 317, a second SHL 310b disposed on the second FL 307b, a second insulation layer 313b disposed on the second SHL 310b, and a second shield 302b disposed on the second insulation layer 313b. The first and second SHLs 310a, 310b may each individually comprise bismuth antimony (BiSb). The first and second FLs 307a, 307b may each individually comprise CoFeB, Co, CoFe, or NiFe. The first and second shields 302a, 302b may each individually comprise a magnetic material, such as NiFe. The first and second insulation layers 313a, 313b may each individually comprise insulating material like SiN, or an oxide like MgO and can be used in combination with a GeNiFe layer adjacent to the BiSb layer to maintain texture and control Bi and Sb interdiffusion.

Side shields 319 are disposed adjacent to the SOT device 301 in the x-direction. The side shields 319 may comprise a magnetic material, such as NiFe. A third insulation layer 309 is disposed on the first SHL 310a and between the SOT device 301 and the side shields 319. The second SHL 310b is disposed in contact with the side shields 319. An antiferromagnetic cap layer 323 is disposed between the side shields 319 and the second insulation layer 313b. The first and second shields 302a, 302b, the first SHL 310a, and the first and second insulation layers 313a, 313b used in combination with GeNiFe layers to control texture and interdiffusion, may each individually have a greater length in the x-direction than the first and second FLs 307a, 307b, the gap layer 317, and the second SHL 310b. A first current 321a flows from the first shield 302a into the gap layer 317, and a second current 321b flows from the gap layer 317 into the second shield 302b. A voltage may be applied to the first and second SHLs 310a, 310b.

The read head 350 of FIG. 3B is similar to the read head 300 of FIG. 3A; however, the read head 350 does not comprise insulation layers or shields. In the read head 350, the first FL 307a is disposed on the first SHL 310a, and an interlayer of GeNiFe could be used in combination with a nonmagnetic barrier in between the FL 307a and SHL layer 310a to reduce BiSb migration. The gap layer 317 is disposed on the first FL 307a, the second FL 307b is disposed on the gap layer 317, and the second SHL 310b is disposed on the second FL 307b and a buffer layer of GeNiFe in combination with a nonmagnetic barrier layer could be used to control the (012) crystal orientation growth of the SHL 310b. The first and second SHLs 310a, 310b have a greater length in the x-direction than the first and second FLs 307a, 307b and the gap layer 317. A first current 321a flows from the first SHL 310a into the gap layer 317, and a second current 321b flows from the gap layer 317 into the second SHL 310b. A voltage may be applied to the first and second SHLs 310a, 310b.

The read head 375 of FIG. 3C is similar to the read head 300 of FIG. 3A; however, the read head 375 further comprises seed layers 325, 329 and interlayers 327a, 327b. The read head 375 comprises the first shield 302a, the first insulation layer 313a disposed on the first shield 302a, a first seed layer 325 disposed on the insulation layer 313a, the first SHL 310a disposed on the first seed layer 325, a first interlayer 327a disposed on the first SHL 310a, the first FL 307a disposed on the first interlayer 327a, the gap layer 317 disposed on the first FL 307a, a second seed layer 329 disposed on the gap layer 317, the second FL 307b disposed on the second seed layer 329, a second interlayer 327b disposed on the second FL 307b, the second SHL 310b disposed on the second interlayer 327b, a cap layer 323 disposed on the second SHL 310b, the second insulation layer 313b disposed on the cap layer 323, and a second shield 302b disposed on the second insulation layer 313b. The capping layer 323 may comprise a migration barrier like GeNiFe layer optionally in combination with an additional nonmagnetic migration barrier adjacent to the BiSb to control Bi, Sb migration. In one embodiment, each layer of the read head 375 has a same length in the x-direction, though they may vary in other embodiments.

The cap layer 323 comprises a material selected from the group consisting of SiN, TiN, $Al_2O_3$, $SiO_2$, NiFeTa, NiTa, NiW, NiFeW, CoHf, CoFeHf, Pt, Co, Cu, Ni, NiCu, CoCu, Ru, Ta, Cr, Au, Rh, other non-magnetic materials, and combinations thereof. The first seed layer 325 comprise a silicide or GeNiFe layer optionally in combination with another non-magnetic barrier. The second seed layer 329 may comprise GeNiFe layer optionally in combination with another non-magnetic barrier. The first interlayer 327a and the second interlayer 327b may each individually comprise a silicide or GeNiFe layer, or in combination with another nonmagnetic barrier to control BiSb intermixing and maintain BiSb texture.

While FIGS. 3A-3C each individually illustrates dual ferromagnetic or dual free layer SOT devices 301, the read heads 300, 350, 375 of FIGS. 3A-3C may instead be utilized with a single ferromagnetic or single free layer SOT device, or a single ferromagnetic or single free layer SOT device comprising an anti-ferromagnetic (AFM) layer, where the AFM layer may comprise a single or multiple layers of PtMn, NiMn, IrMn, IrMnCr, CrMnPt, FeMn, other antiferromagnetic materials, or combinations thereof. An exemplary single ferromagnetic or single free layer SOT device may comprise a substrate or shield, a buffer layer disposed on the substrate, a free layer disposed on the buffer layer, an interlayer deposited on the free layer, an SHL disposed on the interlayer, and a cap layer disposed on the SHL. An exemplary single ferromagnetic or single free layer SOT device comprising an AFM layer may comprise the AFM layer disposed adjacent to the single ferromagnetic or single free layer SOT device, where the AFM layer is recessed from the MFS. Additionally, the single or dual free layer based SOT devices described may be used in magnetic sensor applications outside of a read sensor/reader in magnetic recording, and such sensors may be similarly fabricated as the various reader stacks shown or described.

FIGS. 4A-4E illustrate spin-orbit torque (SOT) devices 400, 455, 465, 485, 495, according to various embodiments. Each of the SOT devices 400, 455, 465, 485, 495 may include additional layers not shown in FIGS. 4A-4E. The SOT devices 400, 455, 465, 485, 495 may each individually be used in the magnetic recording head of the drive 100 of FIG. 1 or other suitable magnetic media drives, such as the read head 211 and/or write head 210 of FIG. 2, and one or more of the read heads 300, 350, 375 of FIGS. 3A-3C. For example, the first and second seed layers 325, 329 and the first and second interlayers 327a, 327b of FIG. 3C may be the buffer layer 405 and/or the interlayer 415 discussed below. Additionally, the various SOT devices/stacks of FIGS. 4A-4E may be used in a magnetic sensor.

Furthermore, while the SOT device 400, 455, 465, 485, 495 are referred to as SOT devices, the SOT device 400, 455, 465, 485, 495 may each individually function as spin torque oscillator (STO) devices. Aspects of each SOT device 400, 455, 465, 485, 495 may be used in combination with one another. When the SOT device 400, 455, 465, 485, 495 are used in a write head, the current flows in-plane to the bismuth antimony (BiSb) layer 410, and the ferromagnetic or free layer is oscillated by the SOT generated by the spin Hall effect in the BiSb layer 410.

Figure 4C:
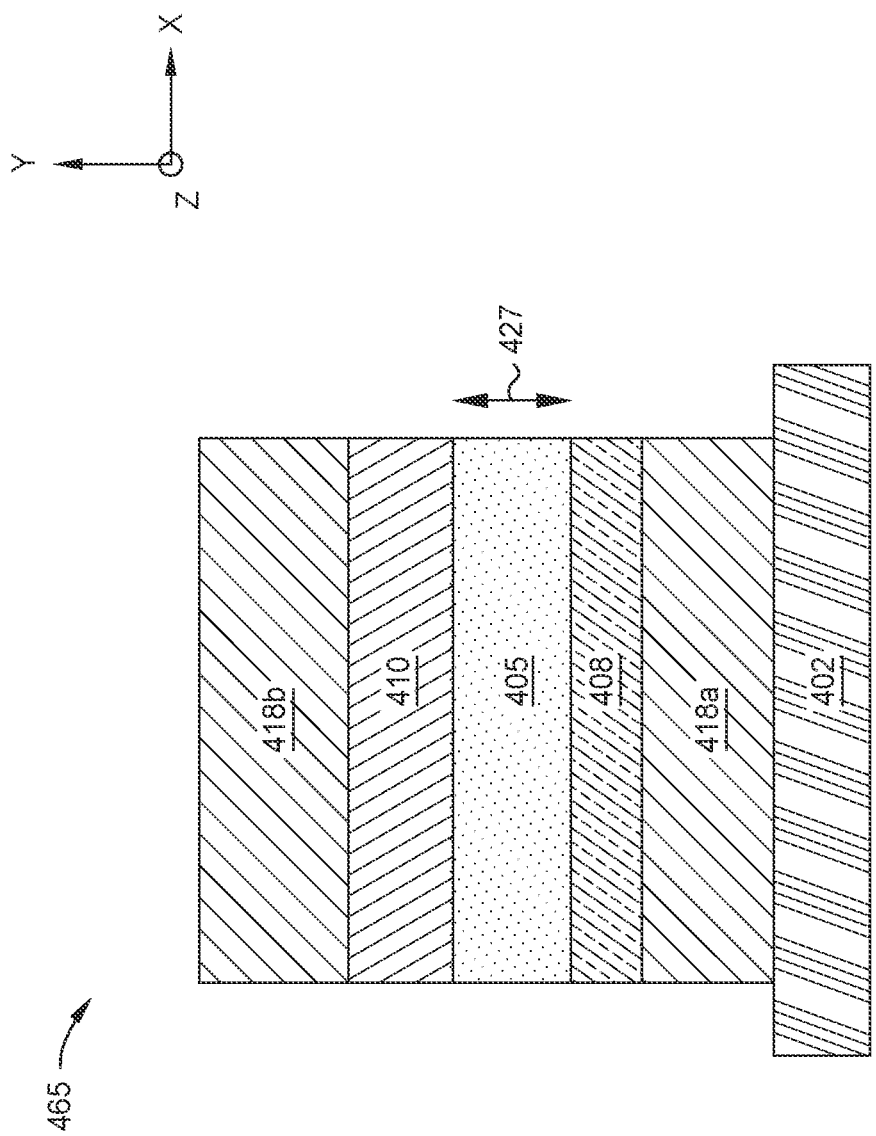
Figure 5A:
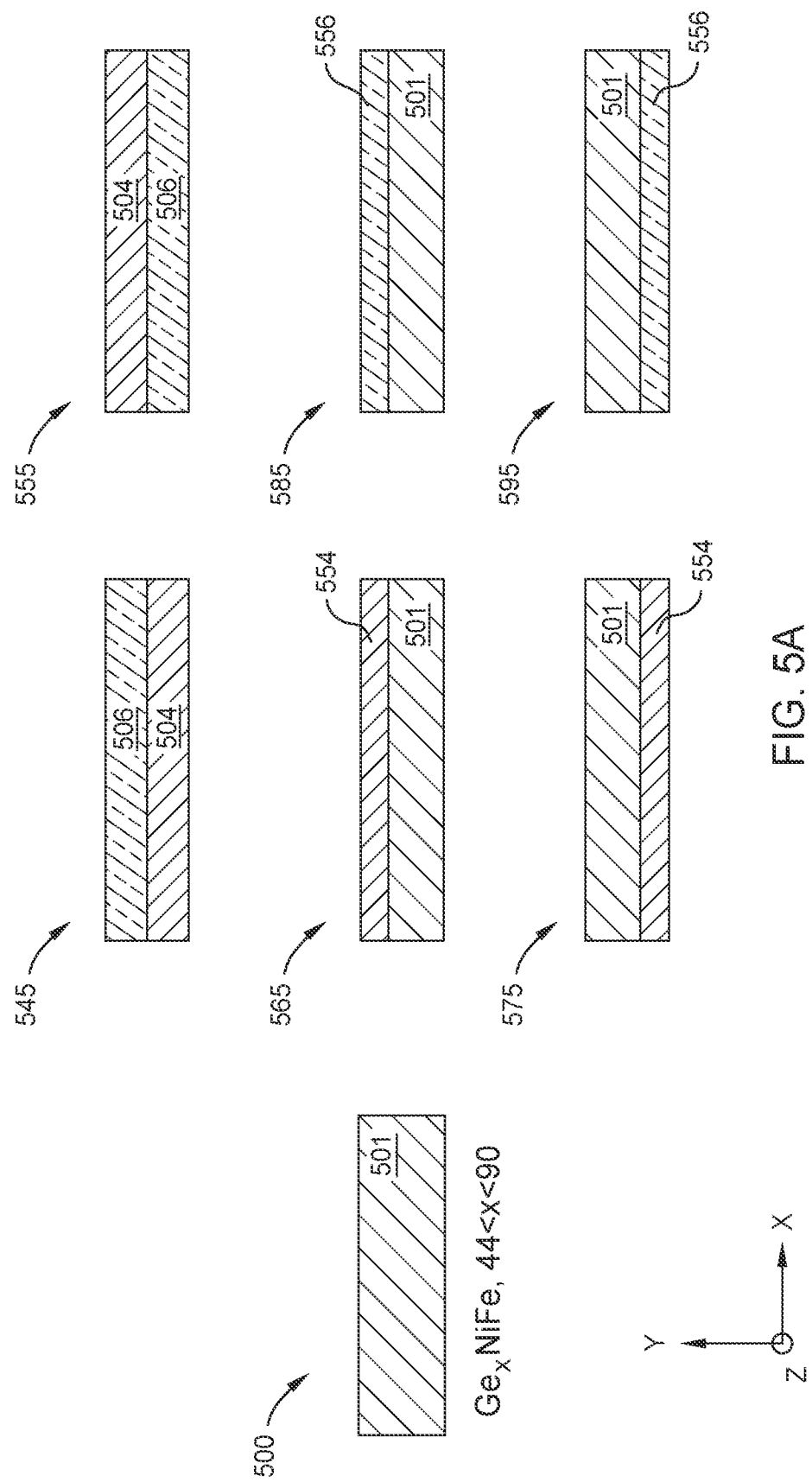
FIGS. 5A-5B illustrate various $Ge_xNiFe$ layers utilized with the SOT devices of FIGS. 4A-4E, according to various embodiments.

FIG. 5A illustrates various GeNiFe layers 500, 545, 555, 565, 575, 585, and 595 utilized with the SOT devices of FIGS. 4A-4E, according to various embodiments. The GeNiFe layers 500, 545, 555, 565, 575, 585, and 595 of FIG. 5A may be used in combination with the SOT devices 400, 455, 465, 485, 495 of FIGS. 4A-4E, and as such, aspects of FIG. 5A may be referred to when describing FIGS. 4A-4E.

Figure 5B:
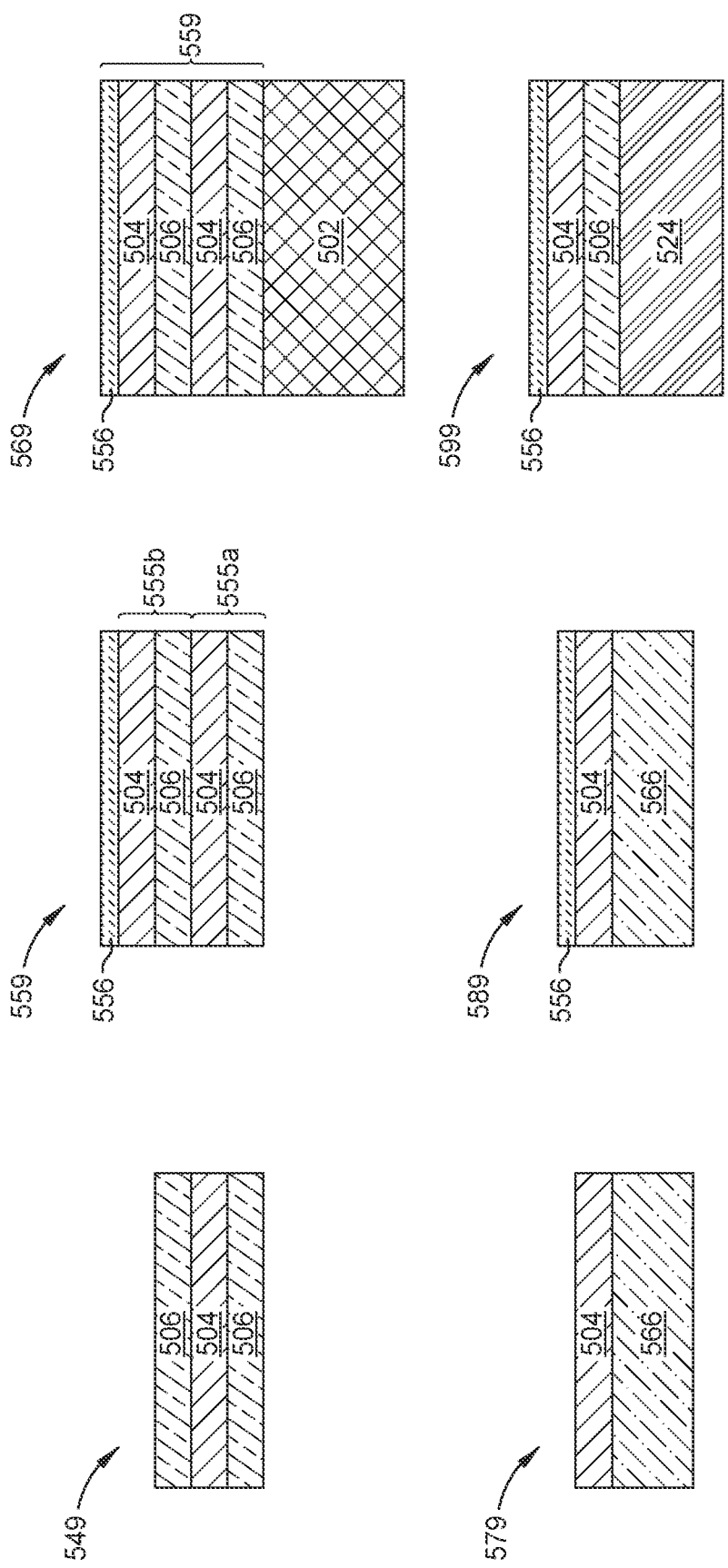

FIG. 5B illustrates various $Ge_X$NiFe layers 549, 559, 569, 579, 589, and 599, where X is a number between about 44 to about 90 atomic percent, utilized as the buffer layer 405 in the SOT devices of FIGS. 4A-4E, according to various embodiments. The GeNiFe layers 549, 559, 569, 579, 589, and 599 of FIG. 5B may be used in combination with the SOT devices 400, 455, 465, 485, 495 of FIGS. 4A-4E, and as such, aspects of FIG. 5B may be referred to when describing FIGS. 4A-4E. Furthermore, the $Ge_X$NiFe layers 549, 559, 569, 579, 589, 599 may each be used in combination with one or more of the $Ge_X$NiFe layers 500, 501, 545, 555, 565, 575, 585, and 595 of FIG. 5A.

The SOT device 400 of FIG. 4A comprises a substrate or a shield (S1) 402, a buffer layer 405 disposed over the shield 402, a BiSb layer 410 disposed on the buffer layer 405 comprising GeNiFe, and one or more additional layer 418 disposed on the BiSb layer 410. The BiSb layer 410 may be referred to herein as a spin Hall effect (SHE) layer 410 or as a topological insulator. The BiSb layer 410 may be the first SHL 310a and/or the second SHL 310b of FIGS. 3A-3C. The BiSb layer 410 may have a thickness in the y-direction of about 60 Å to about 125 Å, such as about 100 Å. The shield 402 may comprise a magnetic material, such as NiFe. The one or more additional layers 418 may comprise, for example, an interlayer, a free layer, a ferromagnetic (FM) layer, one or more magnetic layers, one or more barrier layers comprising a high polarization material that is non-interactive with either an FM layer or a GeNiFe layer, and/or a cap layer.

In the SOT device 400, the BiSb layer 410 is deposited on the buffer layer 405. As the BiSb layer 410 is deposited, the BiSb layer 410 may be doped or remain undoped. When the BiSb layer 410 is undoped, the GeNiFe buffer layer 405 promotes the BiSb layer 410 to grow a (001) crystal orientation. When the BiSb layer 410 is doped, the GeNiFe buffer layer 405 promotes the BiSb layer 410 to grow a (012) crystal orientation. The relatively non-interacting dopant used to promote the (012) orientation of BiSb may be, a gas, a metal, a non-metal, or a ceramic material. To create a strong (012) texture, not the entire BiSb layer 410 needs to be doped, only about the first 10 Å to about 50 Å of the BiSb layer 410 immediately adjacent to the buffer layer 405 needs to be doped. The remaining BiSb layer 410 may then be deposited as undoped BiSb on top of the initially doped portion of BiSb already deposited. Doping only a portion of the BiSb layer 410 is sufficient to promote and grow a (012) orientation of the entire BiSb layer 410. The SOT device 400 can achieve a spin Hall angle (SHA) of about 2 or larger when the BiSb layer 410 has a (012) orientation or a (001) orientation.

Examples of the doping BiSb process is described in co-pending patent application titled "Novel Doping Process To Refine Grain Size For Smoother BiSb Film Surface," U.S. application Ser. No. 17/854,568, filed Jun. 30, 2022, assigned to the same assignee of this application, which is herein incorporated by reference.

The SOT device 455 of FIG. 4B comprises a substrate or a shield (S1) 402, one or more first additional layer 418a disposed over the shield 402, a BiSb layer 410 disposed over the one or more first additional layers 418a, an interlayer 415 comprising GeNiFe disposed on the BiSb layer 410, a barrier layer 408 disposed on the interlayer 415, and one or more second additional layers 418b disposed over the barrier layer 408. The barrier layer 408 comprises a high polarization material that is non-interactive with either an FM layer or a GeNiFe layer, such as NiTaN, NiFeTaN, NiWN, NiFeWN, TaN, CrMoN, NiCrN, or MgO, among others. The one or more first and second additional layers 418a, 418b may each individually comprise, for example, an interlayer, a free layer, a ferromagnetic (FM) layer, one or more magnetic layers, one or more barrier layers comprising a high polarization material that is non-interactive with either an FM layer or a GeNiFe layer, and/or a cap layer. In some embodiments, the interlayer 415 comprises a first sublayer 506 comprising Ge disposed in contact with the BiSb layer 410 and a second sublayer 504 comprising NiFe disposed in contact with the first sublayer 506. In other embodiments, the interlayer 415 may be a single layer, as discussed below in FIGS. 5A-5B.

In the SOT device 455, the interlayer 415 is disposed on the BiSb layer 410. As the BiSb layer 410 is deposited, the BiSb layer 410 may be doped or remain undoped. When the BiSb layer 410 is undoped, the BiSb layer 410 grows a (001) crystal orientation. When the BiSb layer 410 is doped, the BiSb layer 410 grows a (012) crystal orientation. The relatively non-interacting dopant used to promote the (012) orientation of BiSb may be, a gas, a metal, a non-metal, or a ceramic material. To create a strong (012) texture, not the entire BiSb layer 410 needs to be doped, only about the first 10 Å to about 50 Å of BiSb layer 410 immediately adjacent to the interlayer 415 needs to be doped. The remaining BiSb layer 410 may then be deposited as undoped BiSb on top of the initially doped portion of BiSb already deposited. Doping only a portion of the BiSb layer 410 is sufficient to promote and grow a (012) orientation of the entire BiSb layer 410. The SOT device 455 can achieve a spin Hall angle (SHA) of about 2 or larger when the BiSb layer 410 has a (012) orientation or a (001) orientation.

The SOT device 465 of FIG. 4C is similar to the SOT device 400 of FIG. 4A. The SOT device 465 comprises a substrate or a shield (S1) 402, one or more first additional layer 418a disposed over the shield 402, a barrier layer 408 disposed over the one or more first additional layers 418a, a buffer layer 405 comprising GeNiFe disposed on the barrier layer 408, a BiSb layer 410 disposed on the buffer layer 405, and one or more second additional layers 418b disposed over the BiSb layer 410. The one or more first and second additional layers 418a, 418b may each individually comprise, for example, an interlayer, a free layer, a ferromagnetic (FM) layer, one or more magnetic layers, one or more barrier layers, and/or a cap layer. The barrier layer 408 comprises a high polarization material that is non-interactive with either an FM layer or a GeNiFe layer, such as NiTaN, NiFeTaN, NiWN, NiFeWN, TaN, CrMoN, NiCrN, or MgO, among others.

In the SOT device 465, the BiSb layer 410 is deposited on the buffer layer 405. As the BiSb layer 410 is deposited, the BiSb layer 410 may be doped or remain undoped. When the BiSb layer 410 is undoped, the GeNiFe buffer layer 405 promotes the BiSb layer 410 to grow a (001) crystal orientation. When the BiSb layer 410 is doped, the GeNiFe buffer layer 405 promotes the BiSb layer 410 to grow a (012) crystal orientation. The relatively non-interacting dopant used to promote the (012) orientation of BiSb may be, a gas, a metal, a non-metal, or a ceramic material. To create a strong (012) texture, not the entire BiSb layer 410 needs to be doped, only about the first 10 Å to about 50 Å of the BiSb layer 410 immediately adjacent to the buffer layer 405 needs to be doped. The remaining BiSb layer 410 may then be deposited as undoped BiSb on top of the initially doped portion of BiSb already deposited. Doping only a portion of the BiSb layer 410 is sufficient to promote and grow a (012) orientation of the entire BiSb layer 410. The SOT device 465 can achieve a spin Hall angle (SHA) of about 2 or larger when the BiSb layer 410 has a (012) orientation or a (001) orientation.

The buffer layers 405 and interlayers 415 of FIGS. 4A-4C may also be one of the $Ge_x$NiFe layers 500, 501, 545, 555, 565, 575, 585, and 595 of FIG. 5A and/or the $Ge_x$NiFe layers 549, 559, 569, 579, 589, 599 of FIG. 5B. With respect to each of the SOT devices 400, 455, and 465 of FIGS. 4A-4C, in some embodiments, the seed or buffer layer 405 and/or interlayer 415 may be a single alloy layer, as discussed below in FIG. 5A. In other embodiments, the buffer layer 405 and/or the interlayer 415 may be used as a thicker layer 501 constructed of laminated repeated bilayers, like shown in $Ge_x$NiFe layers 545, 555. The thicker laminated bilayer aids in controlling (001) or (012) textured BiSb growth and reduces diffusion or migration through the buffer layer 405 and/or interlayer 415. Dusting layers of Ge 556 or NiFe 554 can be added above or below the laminated $Ge_x$NiFe layer 501, like shown in $Ge_x$NiFe layers 565, 575, 585, 595 of FIG. 5A and in the $Ge_x$NiFe layers 579, 589, of FIG. 5B. The seed or buffer layer 405 has a thickness 427 in the y-direction less than or equal to about 40 Å, such as about 10 Å to about 30 Å. The interlayer 415 has a thickness 437 less than or equal to about 15 Å, such as about 10 Å, and may have a composition different from the buffer layer 405.

Both the buffer layer 405 and the interlayer 415 (which each may be individually referred to herein as a Ge$_x$NiFe (1-x) layer 501 or GeNiFe layer 501) are in some embodiments non-magnetic with compositions for Ge$_x$NiFe(1-x) of 44<x<90 at. %. Thin dusting layers of NiFe and Ge, such as NiFe layer 554 and Ge layer 556, shown in FIGS. 5A-5B, both have a thickness less than about 10 Å. The dusting layers disposed on top of and underneath a Ge$_x$NiFe(1-x) layer 501 provide additional methods of tuning the BiSb (012) layer epitaxy, improving or reducing intermixing with BiSb 410 layer. The dusting layers are depicted in 565, 575, 585, 595 of FIG. 5A and in 569, 579, 589, 599 of FIG. 5B. In the case where the Ge$_x$NiFe(1-x) layer 501 is a bilayer, as shown in Ge$_x$NiFe layers 545 and 555 of FIG. 5A, it is advantageous to have a Ge layer 506 or 516 adjacent to the BiSb layer 410, as Ge does not readily mix with BiSb layer 410.

However, a bilayer such as the Ge$_x$NiFe layer 545 of FIG. 5A as a buffer layer 405, particularly in cases of thicker NiFe layers 504, may be magnetic, and in those cases bilayer 555 may be non-magnetic for the same individual layer thicknesses and be better to use as a buffer layer. Utilizing the bilayer 555 of FIG. 5A with the Ge layer 516 of FIG. 5A next to the BiSb layer 410 further prohibits or minimizes the Sb of the BiSb layer 410 from diffusing into the interlayer 415, as Ge is not soluble in BiSb. However, the bilayer 555 forms a graded composition layer 501 that has high resistivity, which minimizes shunting, as well as reduces SOT-FM intermixing, reduces loss of magnetic moment, and improves thermal stability. The interlayer 415 can be made relatively thin (i.e., less than about 10 Å) to further reduce FM-SOT spacing for better magnetic coupling. The ability to use either bilayers 545 and/or 555 for either the buffer layer 405 or the interlayer 415 offers additional flexibility in building devices. Ge$_x$NiFe layer 500 can be selected from any of 501, 545, 549, 555, 559, 565, 569, 575, 579, 585, 589, 595, and 599 of FIGS. 5A-5B, which offers additional flexibility in manufacturability.

The buffer layer 405 not only provides a strong (001) or (012) texture, the buffer layer 405 also prohibits or minimizes the migration of Bi and Sb of the BiSb layer 410 from diffusing into or through the buffer layer 405, as Ge is not soluble in BiSb, and the interface is sharp which shows very good epitaxy. Because the buffer layer 405 and/or the interlayer 415 has high resistivity (e.g., about 300 μohm-cm), the thin buffer layer 405 and/or interlayer 415 minimizes shunting of the BiSb layer 410, as well as reduces SOT-FM intermixing, reduces moment loss with the FM layer 412, and improves thermal stability. The buffer layer 405 and the interlayer 415 can each be deposited as very thin layers, such as about 10 Å of less, which reduces FM-SOT space for better magnetic coupling.

It is to be further understood that a plurality of the SOT devices 400 can be configured together as part of a memory cell array in which the BiSb layer 410 is a spin orbit material electrode, where a top electrode (not shown) can be disposed over the one or more additional layers 418; that a plurality of the SOT devices 455 can be configured together as part of a memory cell array in which the BiSb layer 410 is a spin orbit material electrode, where a top electrode (not shown) can be disposed over the one or more second additional layers 418b; and that a plurality of the SOT devices 465 can be configured together as part of a memory cell array in which the BiSb layer 410 is a spin orbit material electrode, where a top electrode (not shown) can be disposed over the one or more second additional layers 418b. Each of the memory cells may be part of a two-terminal device or a three terminal device. The spin orbit material electrode and the top electrode may serve as bit lines, word lines, read word lines, write word lines, and combinations thereof. The memory cell array may be implemented as a cross-point array or other architectures.

The SOT device 485 of FIG. 4D comprises a substrate or shield 402, a buffer layer 405 disposed on the shield 402, a BiSb layer 410 disposed on the buffer layer 405, an interlayer 415 disposed on the BiSb layer 410, a first barrier layer 424 disposed on the interlayer 415, a FM layer 412 disposed on the first barrier layer 424, a second barrier layer 426 disposed on the FM layer 412, a seed layer 420 disposed on the second barrier layer 426, and a cap layer 422 disposed on the seed layer 420.

The SOT device 495 of FIG. 4E is similar to the SOT device 485 of FIG. 4D; however, the SOT device 495 is reversed. The SOT device 495 of FIG. 4E comprises a seed layer 420, a first barrier layer 430 disposed on the seed layer 420, a FM layer 412 disposed on the first barrier layer 430, a second barrier layer 432 disposed on the FM layer 412, an interlayer 415 disposed on the second barrier layer 432, a BiSb layer 410 disposed on the interlayer 415, and a buffer layer 405 disposed on the BiSb layer 410.

The BiSb layer 410 may have a thickness in the y-direction of about 60 Å to about 125 Å, such as about 100 Å. The first and second barrier layers 424, 426, 430, 432 may each individually comprise a high polarization material that is non-interactive with either an FM layer or a GeNiFe layer, such as NiTaN, NiFeTaN, NiWN, NiFeWN, TaN, CrMoN, NiCrN, or MgO, among others. The cap layer 422 comprises a material selected from the group consisting of SiN, TiN, Al$_2$O$_3$, SiO$_2$, MgO, NiFeTa, NiTa, NiW, NiFeW, CoHf, CoFeHf, Pt, Co, Cu, Ni, NiCu, CoCu, Ru, Ta, Cr, Au, Rh, other non-magnetic materials, and combinations thereof. The shield 402 may comprise a magnetic material, such as NiFe. The FM layer 412 has a thickness of about 5 Å to about 15 Å in the y-direction, and may comprise NiFe, CoFe, NiFeX, CoFeX, FeX, or CoX, where X=Co, Ni, Cu, Si, Al, Mn, Ge, Ta, and B.

The buffer layer 405, the interlayer 415, and the seed layer 420 may each individually comprise the Ge$_x$NiFe layer(s) of FIGS. 4A-4C discussed above. The buffer layer 405, the interlayer 415, and the seed layer 420 may each individually be one of the Ge$_x$NiFe layers 500, 501, 545, 555, 565, 575, 585, and 595 of FIG. 5A and/or the Ge$_x$NiFe layers 549, 559, 569, 579, 589, 599 of FIG. 5B. The buffer layer 405 and the seed layer 420 each has a thickness in the y-direction less than or equal to about 40 Å, such as about 10 Å to about 30 Å. The interlayer 415 has a thickness less than or equal to about 15 Å, such as about 10 Å, and may have a composition different from the buffer layer 405. The first and second barrier layers 424, 426 may each individually have a thickness in the y-direction less than or equal to about 10 Å.

In the SOT devices 485 and 495, the BiSb layer 410 is sandwiched between the buffer layer 405 and the interlayer 415. As the BiSb layer 410 is deposited, the BiSb layer 410 may be doped or remain undoped. When the BiSb layer 410 is undoped, the Ge$_x$NiFe buffer layer 405 promotes the BiSb layer 410 to grow a (001) crystal orientation. When the BiSb layer 410 is doped, the Ge$_x$NiFe buffer layer 405 promotes the BiSb layer 410 to grow a (012) crystal orientation. The relatively non-interacting dopant used to promote the (012) orientation of BiSb may be, a gas, a metal, a non-metal, or a ceramic material. To create a strong (012) texture, not the entire BiSb layer 410 needs to be doped, only about the first 10 Å to about 50 Å of the BiSb layer 410 immediately adjacent to the buffer layer 405 needs to be doped. The remaining BiSb layer 410 may then be deposited as undoped BiSb on top of the initially doped portion of BiSb already deposited. Doping only a portion of the BiSb layer 410 is sufficient to promote and grow a (012) orientation of the entire BiSb layer 410. The SOT devices 485 and 495 can achieve a spin Hall angle (SHA) of about 2 or larger when the BiSb layer 410 has a (012) orientation or a (001) orientation.

The buffer layer 405 and the interlayer 415 both further prohibit or minimize the Sb of the BiSb layer 410 from diffusing into the buffer layer 405 and/or interlayer 415, as Ge is not soluble in BiSb. Because Ge has high resistivity, the buffer layer 405 and the interlayer 415 both minimize shunting, as well as reduce SOT-FM intermixing and loss of the FM layer's moment, and improce thermal stability. The Ge of the buffer layer 405 and the interlayer 415 further reduces FM-SOT space for better magnetic coupling.

It is to be further understood that a plurality of the SOT devices 485 can be configured together as part of a memory cell array in which the BiSb layer 410 is a spin orbit material electrode; where a top electrode (not shown) can be disposed over the cap layer 422; and that a plurality of the SOT devices 495 can be configured together as part of a memory cell array in which the BiSb layer 410 is a spin orbit material electrode, where a top electrode (not shown) can be disposed over the buffer layer 405. Each of the memory cells may be part of a two-terminal device or a three terminal device. The spin orbit material electrode and the top electrode may serve as bit lines, word lines, read word lines, write word lines, and combinations thereof. The memory cell array may be implemented as a cross-point array or other architectures.

As noted above, each of the SOT devices 400, 455, 465, 485, and 495 of FIGS. 4A-4E may be utilized as BiSb STO devices. BiSb based STO devices, such as the SOT devices 400, 455, 465, 485, and 495 of FIGS. 4A-4E, typically have a larger SHA as compared to conventional STO based devices under the same input current density. For example, when both a conventional SOT device and the BiSb based STO devices have an input inplane current density of $J=4\times10^7$ A/cm$^2$, conventional STO typically have a SHA of about 0.4, whereas the BiSb based STO device has a SHA of about 2 or larger. As the applied magnetic field is increased, the performance of conventional STO devices suffer because a high frequency cannot be achieved. Thus, for conventional STO devices, because of smaller SHA (e.g., 0.4), the detected field range will be smaller. Furthermore, signal sensitivity can be poor. A conventional STO device with a SHA ~0.4 has a sensitivity of about 40 GHz/T, just marginally larger than gyromagnetic ratio ~28 GHz/T. However, in a BiSb based STO device with a SHA of 2 or larger, the linear relationship between detected frequency and the applied magnetic field is expanded in a larger dynamic range. Furthermore, STO signal sensitivity can reach ~100 GHz/T, which is at least twice larger than conventional STO reader. As such, BiSb based STO devices utilized in read heads have a high performance.

FIG. 5A illustrates various Ge$_X$NiFe layers 500, 545, 555, 565, 575, 585, and 595 that can be utilized with the SOT devices of FIGS. 4A-4E, according to various embodiments. The Ge$_X$NiFe layers 500, 545, 555, 565, 575, 585, 595 may each individually be the buffer layer 405 of FIGS. 4A-4E, the interlayer 415 of FIGS. 4B, 4D, and 4E, and/or the seed layer 420 of FIGS. 4D and 4E. Furthermore, the Ge$_X$NiFe layers 500, 501, 545, 555, 565, 575, 585, 595 may each be used in combination with one or more of the Ge$_X$NiFe layers 549, 559, 569, 579, 589, 599 of FIG. 5B.

The Ge$_X$NiFe layer 500 comprises Ge$_X$NiFe, where X is a number between about 44 to about 90 atomic percent. The Ge and NiFe of the Ge$_X$NiFe layer 500 have fully intermixed to become an alloy or a single layer 501. The single Ge$_X$NiFe layer 501 has a thickness in the y-direction less than or equal to about 10 Å.

The Ge$_X$NiFe layer 545 is a bilayer structure, comprising a NiFe layer 504 and a Ge layer 506 disposed on the NiFe layer 504. A BiSb layer and/or FM layer would be disposed adjacent or on the Ge layer 506. The NiFe layer 504 has a thickness in the y-direction of about 0.1 Å to about 5 Å. The Ge layer 506 has a thickness in the y-direction of about 4 Å to about 10 Å. In some embodiments where the Ge$_X$NiFe is used as an interlayer 415, the NiFe layer 504 and the Ge layer 506 collectively have a thickness in the y-direction less than or equal to about 15 Å. In other embodiments where the Ge$_X$NiFe layer is used as a buffer layer 405, the NiFe layer 504 and the Ge layer 506 collectively have a thickness in the y-direction less than or equal to about 40 Å.

The Ge$_X$NiFe layer 555 is similar to the Ge$_X$NiFe layer 545. The Ge$_X$NiFe layer 555 comprises a Ge layer 506 (e.g., a first sublayer) and a NiFe layer 504 (e.g., a second sublayer) disposed on the Ge layer 506. A BiSb layer and/or FM layer would be disposed adjacent or in contact with the Ge layer 506. The NiFe layer 514 has a thickness in the y-direction of about 0.1 Å to about 5 Å. The Ge layer 506 has a thickness in the y-direction of about 4 Å to about 10 Å. In some embodiments where the Ge$_X$NiFe is used as an interlayer 415, the NiFe layer 504 and the Ge layer 506 collectively have a thickness in the y-direction less than or equal to about 15 Å. In other embodiments where the Ge$_X$NiFe layer is used as a buffer layer 405, the NiFe layer 504 and the Ge layer 506 collectively have a thickness in the y-direction less than or equal to about 40 Å.

The Ge$_X$NiFe layer 565 comprises the single layer 501 of Ge$_X$NiFe (e.g., a first sublayer), where X is a number between about 44 to about 90 atomic percent, and a thin NiFe layer 554 (e.g., a second sublayer) disposed on the single layer 501 of Ge$_X$NiFe. A BiSb layer and/or FM layer would be disposed adjacent or in contact with the single layer 501 of Ge$_X$NiFe. The single layer 501 of Ge$_X$NiFe has a thickness in the y-direction less than or equal to about 15 Å. The thin NiFe layer 554 has a thickness in the y-direction of about 1 Å to about 5 Å.

The Ge$_X$NiFe layer 575 is similar to the Ge$_X$NiFe layer 565; however, the Ge$_X$NiFe layer 575 is reversed. The Ge$_X$NiFe layer 575 comprises a thin NiFe layer 554 (e.g., a first sublayer) and the single layer 501 of Ge$_X$NiFe (e.g., a second sublayer), where X is a number between about 44 to about 90 atomic percent disposed on the thin NiFe layer 554. A BiSb layer and/or FM layer would be disposed adjacent or in contact with the single layer 501 of Ge$_X$NiFe. The single layer 501 of Ge$_X$NiFe has a thickness in the y-direction less than or equal to about 15 Å. The thin NiFe layer 554 has a thickness in the y-direction of about 1 Å to about 5 Å.

The Ge$_X$NiFe layer 585 comprises the single layer 501 of Ge$_X$NiFe (e.g., a first sublayer), where X is a number between about 44 to about 90 atomic percent, and a thin Ge layer 556 (e.g., a second sublayer) disposed on the single layer 501 of Ge$_X$NiFe. The single layer 501 of Ge$_X$NiFe has a thickness in the y-direction less than or equal to about 15 Å. The thin Ge layer 556 has a thickness in the y-direction of about 0.1 Å to about 5 Å. In some embodiments where the Ge$_X$NiFe layer 585 is used as an interlayer 415, the single layer 501 of Ge$_X$NiFe and the thin Ge layer 556 collectively have a thickness in the y-direction less than or equal to about 15 Å. In other embodiments where the Ge$_x$NiFe layer 585 is used as a buffer layer 405, the single layer 501 of Ge$_x$NiFe and the thin Ge layer 556 collectively have a thickness in the y-direction less than or equal to about 40 A. A BiSb layer and/or FM layer may be disposed adjacent or in contact with either the single layer 501 of Ge$_x$NiFe or the thin Ge layer 556. As discussed above, a BiSb layer and/or FM layer may be doped to promote a (012) crystalline structure. When the BiSb layer and/or the FM layer is doped, the thin Ge layer 556 may better promote the (012) orientation, and as such, the BiSb layer and/or the FM layer may be disposed in contact with the thin Ge layer 556 rather than the single layer 501 of Ge$_x$NiFe.

The Ge$_x$NiFe layer 595 is similar to the Ge$_x$NiFe layer 585; however, the Ge$_x$NiFe layer 595 is reversed. The Ge$_x$NiFe layer 595 comprises a thin Ge layer 556 (e.g., a first sublayer) and the single layer 501 of Ge$_x$NiFe (e.g., a second sublayer), where X is a number between about 44 to about 90 atomic percent disposed on the thin Ge layer 556. The single layer 501 of Ge$_x$NiFe has a thickness in the y-direction less than or equal to about 15 Å. The thin Ge layer 556 has a thickness in the y-direction of about 0.1 Å to about 5 Å. In some embodiments where the Ge$_x$NiFe is used as an interlayer 415, the single layer 501 of Ge$_x$NiFe and the thin Ge layer 556 collectively have a thickness in the y-direction less than or equal to about 15 Å. In other embodiments where the Ge$_x$NiFe is used as a buffer layer 405, the single layer 501 of Ge$_x$NiFe and the thin Ge layer 556 collectively have a thickness in the y-direction less than or equal to about 40 Å. A BiSb layer and/or FM layer may be disposed adjacent or in contact with either the single layer 501 of Ge$_x$NiFe or the thin Ge layer 556. As discussed above, a BiSb layer and/or FM layer may be doped to promote a (012) crystalline structure. When the BiSb layer and/or the FM layer is doped, the thin Ge layer 556 may better promote the (012) orientation, and as such, the BiSb layer and/or the FM layer may be disposed in contact with the thin Ge layer 556 rather than the single layer 501 of Ge$_x$NiFe.

FIG. 5B illustrates various Ge$_x$NiFe layers 549, 559, 569, 579, 589, and 599, where X is a number between about 44 to about 90 atomic percent. The Ge$_x$NiFe layers 549, 559, 569, 579, 589, 599 may each individually be the buffer layer 405 of FIGS. 4A-4E, the interlayer 415 of FIGS. 4B, 4D, and 4E, and/or the seed layer 420 of FIGS. 4D and 4E. Furthermore, the Ge$_x$NiFe layers 549, 559, 569, 579, 589, 599 may each be used in combination with one or more of the Ge$_x$NiFe layers 500, 501, 545, 555, 565, 575, 585, and 595 of FIG. 5A.

The Ge$_x$NiFe layer 549 is a multilayer structure and is similar to the Ge$_x$NiFe layer 545 and the Ge$_x$NiFe 555 of FIG. 5A. The Ge$_x$NiFe 549 comprises a first Ge layer 506, a NiFe layer 504 disposed on the first Ge layer 506, and a second Ge layer 506 disposed on the NiFe layer 504. The NiFe layer 504 has a thickness in the y-direction of about 0.1 Å to about 5 Å. Each Ge layer 506 has a thickness in the y-direction of about 4 Å to about 10 Å. By depositing the NiFe layer 504 on the first Ge layer 506, the Ge$_x$NiFe layer 549 is non-magnetic. By depositing the second Ge layer 506 on the NiFe layer 504, the second Ge layer 506 will be adjacent or in contact with the BiSb layer in an SOT device.

The Ge$_x$NiFe layer 559 is a multilayer structure and is similar to the Ge$_x$NiFe 555 of FIG. 5A; however, the Ge$_x$NiFe layer 559 is a thicker laminated structure. The Ge$_x$NiFe 559 comprises a first Ge layer 506 and a first NiFe layer 504 disposed on the first Ge layer 506, forming a first Ge$_x$NiFe sublayer 555a. The Ge$_x$NiFe 559 further comprises a second Ge layer 506 disposed on the first NiFe layer 504 and a second NiFe layer 504 disposed on the second Ge layer 506, forming a second Ge$_x$NiFe sublayer 555b. In other words, the Ge$_x$NiFe layer 559 comprises two Ge$_x$NiFe layers 555 of FIG. 5A stacked on top of one another in a thicker laminated structure. Each NiFe layer 504 has a thickness in the y-direction of about 0.1 Å to about 4 Å. Each Ge layer 506 has a thickness in the y-direction of about 4 Å to about 10 Å.

Because the buffer layer 405 may have a thickness equal to or less than about 40 Å, such as about 10 Å to about 30 Å, the buffer layer 405 may comprise a thicker, laminated Ge$_x$NiFe layer 559. A thin dusting Ge layer 556 is then deposited on the second Ge$_x$NiFe layer 555b. The thin dusting Ge layer 556 has a thickness equal to or less than about 8 Å. By depositing the first NiFe layer 504 on the first Ge layer 506, the Ge$_x$NiFe layer 559 is non-magnetic. By depositing the thin dusting Ge layer 556 on the second NiFe layer 504, the thin dusting Ge layer 556 will be adjacent or in contact with the BiSb layer in an SOT device.

The Ge$_x$NiFe layer 569 is a multilayer structure comprising the Ge$_x$NiFe layer 559. In the Ge$_x$NiFe 569, the Ge$_x$NiFe layer 559 is deposited on a shield 502, which may comprise NiFe. Each NiFe layer 504 has a thickness in the y-direction of about 0.1 Å to about 5 Å. Each Ge layer 506 has a thickness in the y-direction of about 4 Å to about 10 Å. Because the Ge$_x$NiFe layer 559 is a thicker laminated Ge$_x$NiFe layer, the Ge$_x$NiFe 569 is still a non-magnetic structure, regardless of the first Ge layer 506 being deposited on the NiFe shield 502.

The Ge$_x$NiFe layer 579 is a multilayer structure comprising a seed Ge layer 566 and a NiFe layer 504 disposed on the seed Ge layer 566. The seed Ge layer has a thickness equal to or less than about 45 Å. The NiFe layer 504 has a thickness in the y-direction of about 0.1 Å to about 8 Å.

The Ge$_x$NiFe layer 589 is similar to the Ge$_x$NiFe layer 579; however, the Ge$_x$NiFe 589 comprises a thin dusting Ge layer 556 disposed on the NiFe layer 504. The thin dusting Ge layer 556 has a thickness equal to or less than about 8 Å.

The Ge$_x$NiFe layer 599 is a multilayer structure comprising a Ge layer 506 disposed on a non-magnetic barrier or seed layer 524, a NiFe layer 504 disposed on the Ge layer 506, and a thin dusting Ge layer 556 disposed on the NiFe layer 504. Each NiFe layer 504 has a thickness in the y-direction of about 0.1 Å to about 5 Å. Each Ge layer 506 has a thickness in the y-direction of about 4 Å to about 10 Å. The thin dusting Ge layer 556 has a thickness equal to or less than about 8 Å. The non-magnetic barrier or seed layer 524 comprise a high polarization material that is non-interactive with either an FM layer or a GeNiFe layer, such as NiTaN, NiFeTaN, NiWN, NiFeWN, TaN, CrMoN, NiCrN, or MgO, among others. The non-magnetic barrier or seed layer 524 has a thickness of about 3 Å to about 5 Å. The non-magnetic barrier or seed layer 524 may further be disposed in contact with an FM layer. The non-magnetic barrier or seed layer 524 prevents the FM layer from affecting the Ge$_x$NiFe layer 599.

Figure 6A:
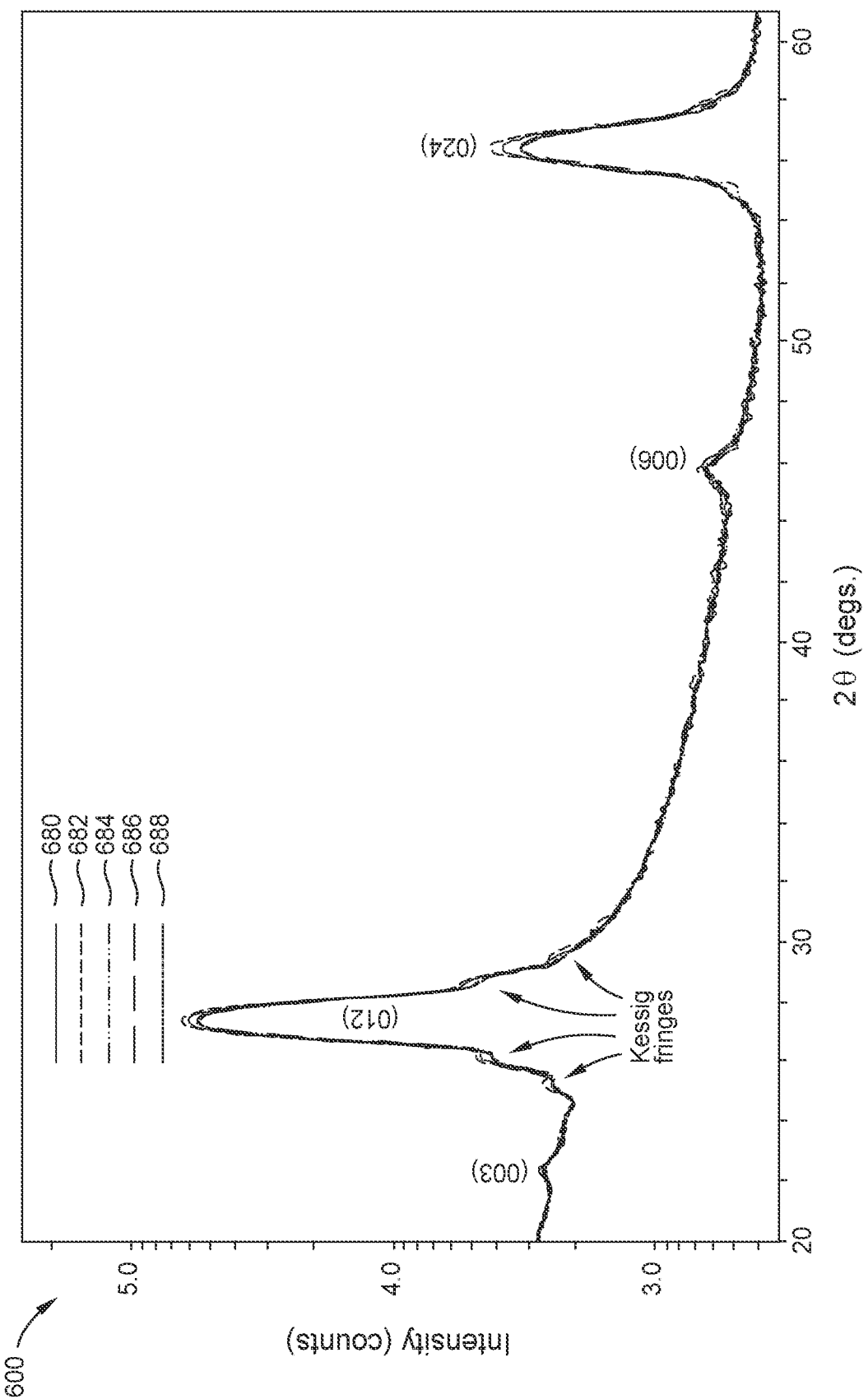
FIG. 6A illustrates a graph showing the crystalline orientation of various doped BiSb layers disposed over a $Ge_xNiFe$ layer, according to one embodiment.

FIG. 6A illustrates a graph 600 showing the crystalline orientation of various doped BiSb layers disposed over a Ge$_x$NiFe layer, according to one embodiment. The Ge$_x$NiFe layer may be any Ge$_x$NiFe layer of FIGS. 5A-5B, or the buffer layer 405 of FIGS. 4A, 4C, 4D, and/or 4E, the interlayer 415 of FIGS. 4B, 4D, and/or 4E, and/or the seed layer 420 of FIGS. 4D and/or 4E. The BiSb layer may be the BiSb layer 410 of FIGS. 4A-4E. The dopant used to promote the (012) orientation of the BiSb layers may be a gas, a metal, a non-metal, or a ceramic material.

In the graph 600, each of lines 680-688 represents a stack including a Nitrogen doped BiSbN layer having a thickness of about 9 nm to about 11 nm, a Ge seed of about 50 Å to about 70 Å, and a $Ge_x$NiFe buffer layer of about 6 Å Ge/about 4 Å NiFe/about 3 Å NiTaN and an interlayer of NiTaN of about 10 Å (as used herein a "/" denotes a boundary between layers or materials in a stack). As indicated by the arrows labeled 'Kessig fringes' in the graph 600, each doped BiSbN layer illustrated by lines 680-688 achieves a strong (012) crystal orientation. Thus, the $Ge_x$NiFe layer will promote a (012) orientation for doped BiSb layers regardless of the thickness of the BiSb layer.

Figure 6B:
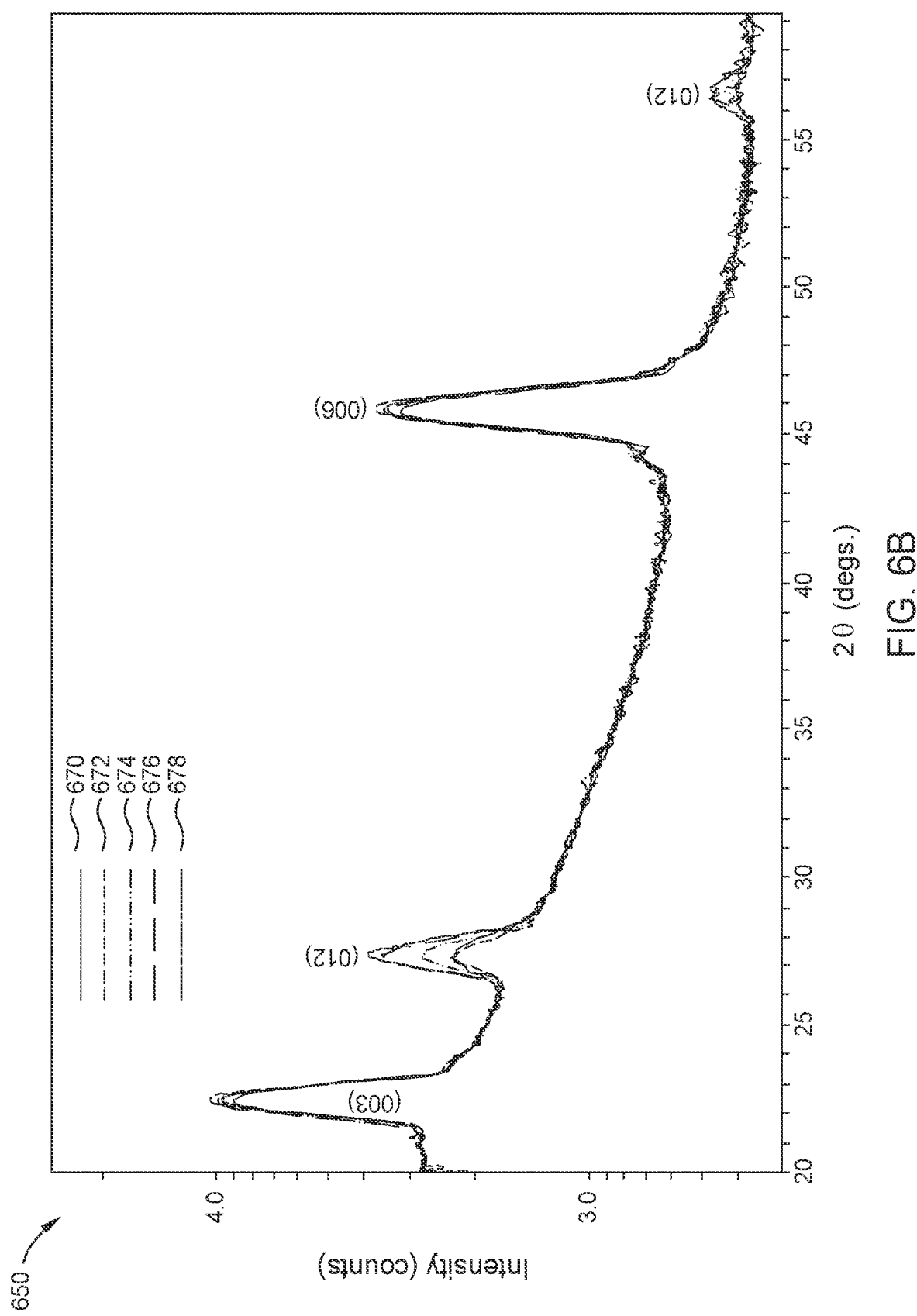
FIG. 6B illustrates a graph showing the crystalline orientation of various undoped BiSb layers disposed over a $Ge_xNiFe$ layer, according to another embodiment.

FIG. 6B illustrates a graph 650 showing the (001) crystalline orientation of various undoped BiSb layers disposed over a $Ge_x$NiFe layer, according to one embodiment. The $Ge_x$NiFe layer may be any $Ge_x$NiFe layer of FIGS. 5A-5B, or the buffer layer 405 of FIGS. 4A, 4C, 4D, and/or 4E, the interlayer 415 of FIGS. 4B, 4D, and/or 4E, and/or the seed layer 420 of FIGS. 4D and/or 4E. The BiSb layer may be the BiSb layer 410 of FIGS. 4A-4E.

In the graph 650, each of lines 670-678 represents a stack including an undoped BiSb layer, a Ge seed of about 50 Å to about 70 Å, and a $Ge_x$NiFe buffer layer of about 6 Å Ge/about 4 Å NiFe/about 3 Å NiTaN and an interlayer of NiTaN of about 10 Å. As indicated by the peaks labeled (003) in the graph 650, each undoped BiSb layer illustrated by lines 670-678 achieves a strong (001) crystal orientation. Thus, the $Ge_x$NiFe layer is shown to promote a (001) orientation for undoped BiSb layers regardless of the thickness of the BiSb layer.

Figure 7A:
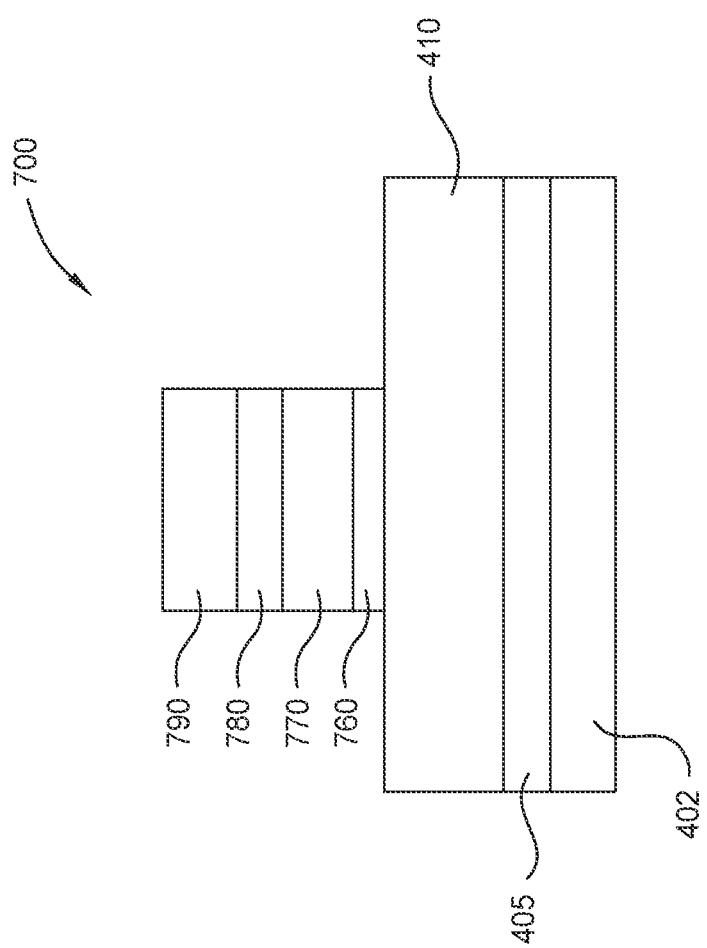
FIG. 7A is a schematic cross-sectional view of a SOT device for use in a MAMR write head, such as in the magnetic recording head of the drive of FIG. 1 or other suitable magnetic media drives.

FIG. 7A is a schematic cross-sectional view of a SOT device 700 for use in a MAMR write head, such as a MAMR write head that can be used as part of the magnetic recording head of the drive 100 of FIG. 1 or other suitable magnetic media drives. The SOT device 700 comprises a doped BiSb layer 410 with a (001) orientation, or alternatively, an undoped BiSb layer 410 with a (012) orientation, formed over a buffer layer 405 formed over a shield or substrate 402, such as the BiSb layer 410 of FIGS. 4A-4E. The buffer layer 405 may comprise GeNiFe and have the same or similar properties as described above with respect to various embodiments. A spin torque layer (STL) 770 is formed over the BiSb layer 410. The STL 770 comprises a ferromagnetic material such as one or more layers of CoFe, CoIr, NiFe, and CoFeX alloy wherein X=B, Ta, Re, or Ir. The STL 770 may be a free layer, such as the free layers 307a, 307b of FIGS. 3A-3C. As such, the STL 770 may be referred to as a free layer.

In certain embodiments, an electrical current shunt block layer 760 is disposed between the BiSb layer 410 and the STL 770. The electrical current shunt blocking layer 760 reduces electrical current from flowing from the BiSb layer 410 to the STL 770 but allows spin orbital coupling of the BiSb layer 410 and the STL 770. In certain embodiments, the electrical current shunt blocking layer 760 comprises a magnetic material which provides greater spin orbital coupling between the BiSb layer 410 and the STL 770 than a non-magnetic material. In certain embodiments, the electrical current shunt blocking layer 760 comprises FeCo, FeCoM, FeCoMO, FeCoMMeO, FeCoM/MeO stack, FeCoMNiMnMgZnFeO, FeCoM/NiMnMgZnFeO stack, multiple layers/stacks thereof, or combinations thereof in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr. In certain embodiments, the electrical current shunt blocking layer 760 is formed to a thickness from about 10 Å to about 100 Å. In certain aspects, an electrical current shunt blocking layer 760 having a thickness of over 100 Å may reduce spin orbital coupling of the BiSb layer 410 and the STL 770. In certain aspects, an electrical current shunt blocking layer having a thickness of less than 10 Å may not sufficiently reduce electrical current from BiSb layer 410 to the STL 770.

In certain embodiments, additional layers are formed over the STL 770 such as a spacer layer 780 and a pinning layer 790. The pinning layer 790 can partially pin the STL 770. The pinning layer 790 comprises a single or multiple layers of PtMn, NiMn, IrMn, IrMnCr, CrMnPt, FeMn, other antiferromagnetic materials, or combinations thereof. The spacer layer 780 comprises single or multiple layers of magnesium oxide, aluminum oxide, other non-magnetic materials, or combinations thereof.

Figure 7C:
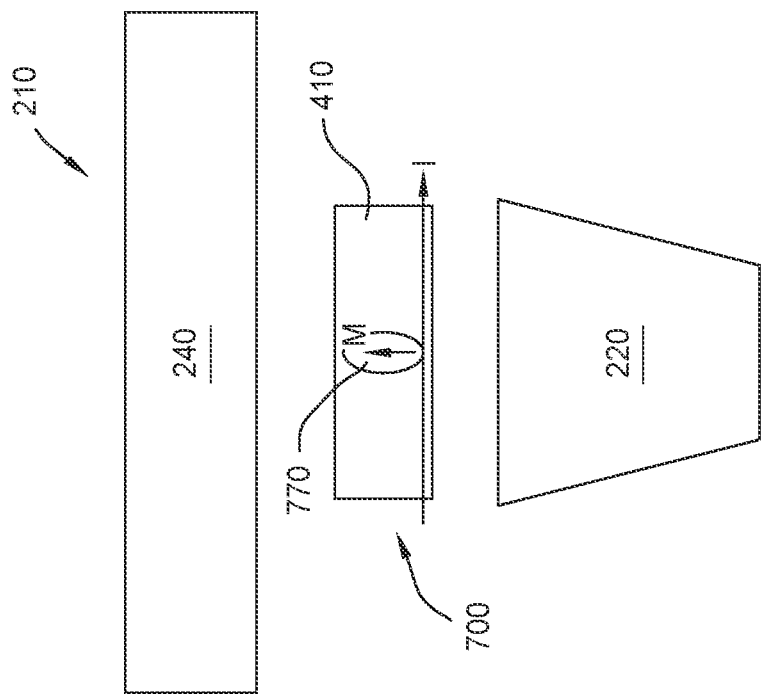
FIGS. 7B-7C are schematic MFS views of certain embodiments of a portion of a MAMR write head with a SOT device of FIG. 7A.
Figure 7B:
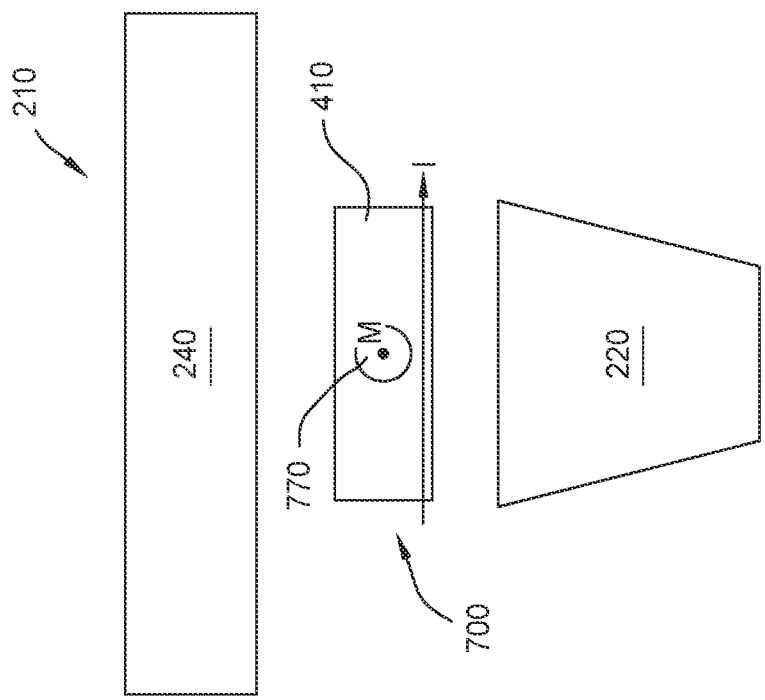

FIGS. 7B-7C are schematic MFS views of certain embodiments of a portion of a MAMR write head 210 with a SOT device 700 of FIG. 7A. The MAMR write head 210 can be the write head in FIG. 2 or other suitable write heads usable in the drive 100 of FIG. 1 or other suitable magnetic media drives such as tape drives. The MAMR write head 210 includes a main pole 220 and a trailing shield 240 in a down-track direction. The SOT device 700 is disposed in a gap between the main pole 220 and the trailing shield 240.

During operation, charge current through a BiSb layer or layer stack 410 acting as a spin Hall layer generates a spin current in the BiSb layer. The spin orbital coupling of the BiSb layer and a spin torque layer (STL) 770 causes switching or precession of magnetization of the STL 770 by the spin orbital coupling of the spin current from the BiSb layer 410. Switching or precession of the magnetization of the STL 770 can generate an assisting AC field to the write field. Energy assisted write heads based on SOT have multiple times greater power efficiency in comparison to MAMR write heads based on spin transfer torque. As shown in FIG. 7B, an easy axis of a magnetization direction of the STL 770 is perpendicular to the MFS from shape anisotropy of the STL 770, from the pinning layer 790 of FIG. 7A, and/or from hard bias elements proximate the STL 770. As shown in FIG. 7C, an easy axis of a magnetization direction of the STL 770 is parallel to the MFS from shape anisotropy of the STL 770, from the pinning layer 790 of FIG. 7A, and/or from hard bias elements proximate the STL 770.

Figure 8:
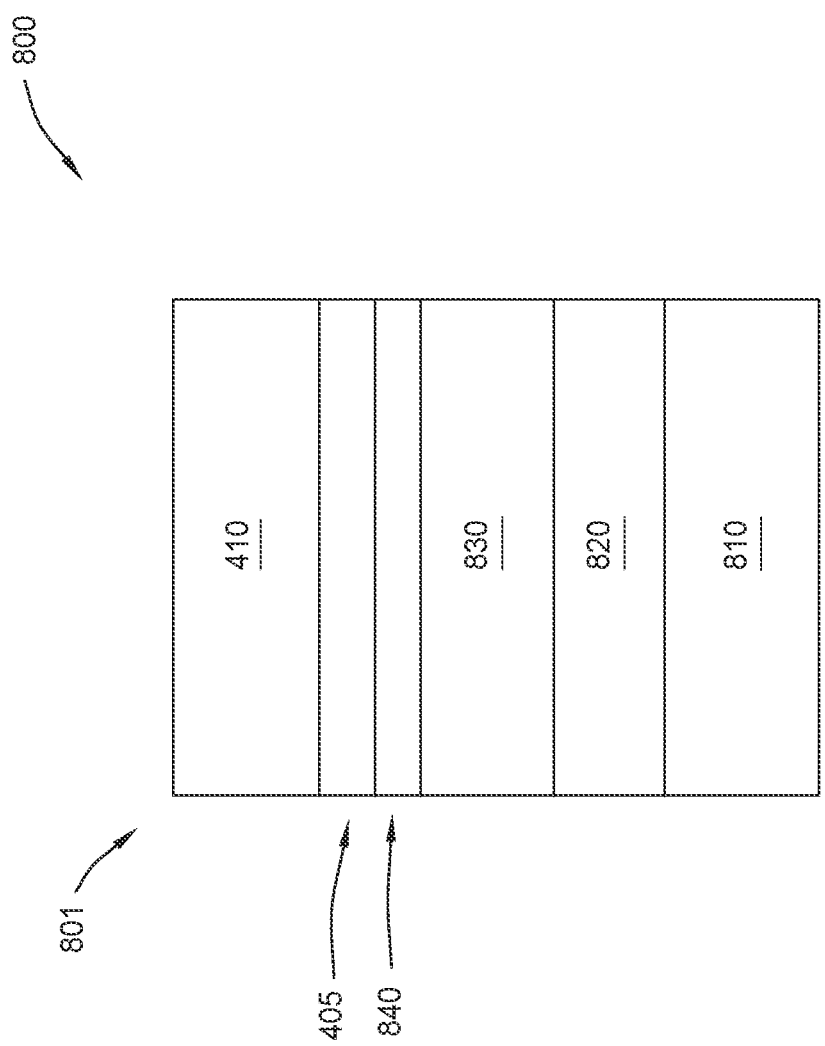
FIG. 8 is a schematic cross-sectional view of a SOT used as a MRAM device.

FIG. 8 is a schematic cross-sectional view of a SOT magnetic tunnel junction (MTJ) 801 used as a MRAM device 800. The MRAM device 800 comprises a reference layer (RL) 810, a spacer layer 820 over the RL 810, a recording layer 830 over the spacer layer 820, a buffer layer 405 over an electrical current shunt block layer 840 over the recording layer 830, and a BiSb layer or layer stack 410 over the buffer layer 405. The BiSb layer 410 may be the BiSb layer 410 of FIGS. 4A-4E. The buffer layer 405 may comprise GeNiFe and have the same or similar properties as described above with respect to various embodiments. The BiSb layer 410 may be a doped BiSb layer having a (012) orientation or an undoped BiSb layer having a (001) orientation. The RL 810 may be a free layer, such as the free layer 307a, 307b of FIGS. 3A-3C. As such, the RL 810 may be referred to as a free layer.

The RL 810 comprises single or multiple layers of CoFe, other ferromagnetic materials, and combinations thereof. The spacer layer 820 comprises single or multiple layers of magnesium oxide, aluminum oxide, other dielectric materials, or combinations thereof. The recording layer 830 comprises single or multiple layers of CoFe, NiFe, other ferromagnetic materials, or combinations thereof.

As noted above, in certain embodiments, the electrical current shunt block layer 840 is disposed between the buffer layer 405 and the recording layer 830. The electrical current shunt blocking layer 840 reduces electrical current from flowing from the BiSb layer 410 to the recording layer 830 but allows spin orbital coupling of the BiSb layer 410 and the recording layer 830. For example, writing to the MRAM device can be enabled by the spin orbital coupling of the BiSb layer and the recording layer 830, which enables switching of magnetization of the recording layer 830 by the spin orbital coupling of the spin current from the BiSb layer 410. In certain embodiments, the electrical current shunt blocking layer 840 comprises a magnetic material which provides greater spin orbital coupling between the BiSb layer 410 and the recording layer 830 than a non-magnetic material. In certain embodiments, the electrical current shunt blocking layer 840 comprises FeCoM, FeCoMO, FeCoM-MeO, FeCoM/MeO stack, FeCoMNiMnMgZnFeO, FeCoM/NiMnMgZnFeO stack, multiple layers/stacks thereof, or combinations thereof, in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr.

The MRAM device 800 of FIG. 8 may include other layers, such as pinning layers, pinning structures (e.g., a synthetic antiferromagnetic (SAF) pinned structure), electrodes, gates, and other structures. Other MRAM devices besides the structure of FIG. 8 can be formed utilizing a doped BiSb layer 410 with a (001) orientation, or alternatively, an undoped BiSb layer 410 with a (012) orientation, over a buffer layer 405 to form a SOT MTJ 801.

Therefore, when SOT devices or STO devices comprise at least one $Ge_xNiFe$ layer, such as buffer layers, interlayers, and/or seed layers comprising $Ge_xNiFe$, the $Ge_xNiFe$ layer(s) can be utilized to promote a (012) crystal orientation in doped BiSb layers or to promote a (001) crystal orientation in undoped BiSb layers. The one or more $Ge_xNiFe$ layers further prohibit or minimize the Sb of the BiSb layer from diffusing into adjacent layers, as Ge is not soluble in BiSb. Because Ge has high resistivity, the $Ge_xNiFe$ layer(s) minimize shunting, as well as reduce SOT-FM intermixing and loss of moment in the FM layer, and improve thermal stability. The $Ge_xNiFe$ layer(s) further reduces FM-SOT space for better magnetic coupling. Such SOT devices comprising a BiSb layer and one or more $Ge_xNiFe$ layer(s) can achieve a SHA of about 2 or larger when the BiSb layer has either a (012) orientation or a (001) orientation.

In one embodiment, a SOT device comprises a first Germanium Nickel Iron ($Ge_xNiFe$) comprising layer, where x is numeral between 44 and 90, the first $Ge_xNiFe$ comprising layer having a thickness less than or equal to about 40 Å, and a BiSb layer disposed over the first $Ge_xNiFe$ comprising layer, wherein: the BiSb layer is doped and has a (012) crystal orientation, or the BiSb layer is undoped and has a (001) crystal orientation.

The first $Ge_xNiFe$ is an interlayer having a thickness equal to or less than 15 Å. The first $Ge_xNiFe$ comprising layer is disposed in contact with the BiSb layer. The SOT device further comprises a second $Ge_xNiFe$ comprising layer disposed over the BiSb layer. The BiSb layer is doped, and a dopant for the BiSb layer comprises a gas, a metal, a non-metal, or a ceramic material. The BiSb layer is doped, and only a first portion of the BiSb layer deposited is doped. A magnetic recording head comprises the SOT device. A magnetic recording device comprises the magnetic recording head. A magneto-resistive memory comprises the SOT device. A magnetic sensor comprises the SOT device.

In another embodiment, a SOT device comprises a first $Ge_xNiFe$ comprising layer, where x is numeral between 44 and 90, a BiSb layer disposed in contact with the first Ge comprising layer, wherein: the BiSb layer is doped and has a (012) crystal orientation, or the BiSb layer is undoped and has a (001) crystal orientation, a second $Ge_xNiFe$ comprising layer, where x is numeral between 44 and 90, disposed over the BiSb layer, and a ferromagnetic layer disposed over the second $Ge_xNiFe$ comprising layer.

The SOT device further comprises a first barrier layer disposed between and in contact with the second $Ge_xNiFe$ comprising layer and the ferromagnetic layer. The first barrier layer comprises a high polarization material selected from the group consisting of NiTaN, NiFeTaN, NiWN, NiFeWN, TaN, CrMoN, NiCrN, and MgO. The SOT device further comprises a third $Ge_xNiFe$ comprising layer disposed over the ferromagnetic layer, and a second barrier layer disposed between and in contact with the third $Ge_xNiFe$ comprising layer and the ferromagnetic layer. The first Ge comprising layer comprises a first sublayer of $Ge_xNiFe$, where x is numeral between 44 and 90, and a second sublayer of Ge. The first $Ge_xNiFe$ comprising layer has a thickness less than or equal to about 40 Å. The second sublayer of Ge is disposed in contact with the BiSb layer, and wherein the second sublayer has a thickness less than the first sublayer. The first $Ge_xNiFe$ comprising layer comprises a first sublayer of $Ge_xNiFe$, where x is numeral between 44 and 90, and a second sublayer of NiFe, wherein the second sublayer of NiFe is disposed in contact with the BiSb layer, and wherein the second sublayer has a thickness less than the first sublayer. A magnetic recording head comprises the SOT device. A magnetic recording device comprises the magnetic recording head. A magneto-resistive memory comprises the SOT device. A magnetic sensor comprises the SOT device.

In yet another embodiment, a SOT device comprises a buffer layer comprising $Ge_xNiFe$, the buffer layer having a thickness less than or equal to about 40 Å, a BiSb layer disposed over the buffer layer, wherein: the BiSb layer is doped and has a (012) crystal orientation, or the BiSb layer is undoped and has a (001) crystal orientation, and one or more magnetic layers.

The BiSb layer has a thickness greater than the thickness of the buffer layer. The SOT device further comprises an interlayer disposed over the BiSb layer, the interlayer comprising $Ge_xNiFe$, wherein the interlayer has a thickness less than or equal to about 15 Å. The buffer layer comprises a first sublayer of $Ge_xNiFe$, where x is numeral between 44 and 90, and a second sublayer of NiFe, wherein the first sublayer of $Ge_xNiFe$ is disposed in contact with the BiSb layer, and wherein the second sublayer has a thickness less than the first sublayer. A magnetic recording head comprises the SOT device. A magnetic recording device comprises the magnetic recording head. A magneto-resistive memory comprises the SOT device. A magnetic sensor comprises the SOT device.

In another embodiment, a SOT device comprises a buffer layer, a BiSb layer disposed on the buffer layer, wherein the BiSb layer is doped and has a (012) crystal orientation, or the BiSb layer is undoped and has a (001) crystal orientation, an interlayer disposed on the BiSb layer, wherein at least one of the buffer layer and the interlayer comprises Germanium Nickel Iron ($Ge_xNiFe$), where x is numeral between 44 and 90, a first barrier layer disposed on the interlayer, a ferromagnetic layer disposed on the first barrier layer, a second barrier layer disposed on the ferromagnetic layer, and a cap layer disposed on the second barrier layer.

The interlayer comprises $Ge_xNiFe$, the interlayer having a thickness less than or equal to about 15 Å. The buffer layer comprises $Ge_xNiFe$, the buffer layer having a thickness less than or equal to about 40 Å. The interlayer and the buffer layer each individually comprise $Ge_xNiFe$, and wherein the interlayer and the buffer layer each individually have a smaller thickness than the BiSb layer. A magnetic recording head comprises the SOT device. A magnetic recording device comprises the magnetic recording head. A magneto-resistive memory comprises the SOT device. A magnetic sensor comprises the SOT device.

In yet another embodiment, a SOT device comprises a seed layer, a first barrier layer disposed on the seed layer, a ferromagnetic layer disposed on the first barrier layer, a second barrier layer disposed on the ferromagnetic layer, an interlayer disposed on the second barrier layer, a BiSb layer disposed on the interlayer, wherein the BiSb layer is doped and has a (012) crystal orientation, or the BiSb layer is undoped and has a (001) crystal orientation, and a buffer layer disposed on the BiSb layer, wherein at least one of the seed layer, the interlayer, and the buffer layer comprises Germanium Nickel Iron ($Ge_xNiFe$), where x is numeral between 44 and 90.

The interlayer has a thickness less than or equal to about 15 Å, wherein the buffer layer has a thickness less than or equal to about 40 Å, and wherein the BiSb layer has a thickness greater than the thickness of the buffer layer. At least one of the buffer layer and the interlayer comprises $Ge_xNiFe$. The first barrier layer and the second barrier layer each individually comprise a high polarization material selected from the group consisting of NiTaN, NiFeTaN, NiWN, NiFeWN, TaN, CrMoN, NiCrN, and MgO. A magnetic recording head comprises the SOT device. A magnetic recording device comprises the magnetic recording head. A magneto-resistive memory comprises the SOT device. A magnetic sensor comprises the SOT device.

While the foregoing is directed to embodiments of the present disclosure, other and further embodiments of the disclosure may be devised without departing from the basic scope thereof, and the scope thereof is determined by the claims that follow.

What is claimed is:

1. A spin-orbit torque (SOT) device, comprising:
    a first Germanium Nickel Iron ($Ge_xNiFe$) comprising layer, where x is numeral between 44 and 90, the first $Ge_xNiFe$ comprising layer having a thickness less than or equal to about 40 Å; and
    a bismuth antimony (BiSb) layer disposed over the first $Ge_xNiFe$ comprising layer, wherein:
        the BiSb layer is doped and has a (012) crystal orientation, or
        the BiSb layer is undoped and has a (001) crystal orientation.

2. The SOT device of claim 1, wherein the first $Ge_xNiFe$ comprising layer is an interlayer having a thickness equal to or less than about 15 Å.

3. The SOT device of claim 1, wherein the first $Ge_xNiFe$ comprising layer is disposed in contact with the BiSb layer.

4. The SOT device of claim 1, further comprising a second $Ge_xNiFe$ comprising layer disposed over the BiSb layer.

5. The SOT device of claim 1, wherein the BiSb layer is doped, and a dopant for the doped BiSb layer comprises a gas, a metal, a non-metal, or a ceramic material.

6. The SOT device of claim 1, wherein the BiSb layer is doped, and only a first portion of the BiSb layer deposited is doped.

7. A magnetic recording head comprising the SOT device of claim 1.

8. A magnetic recording device comprising the magnetic recording head of claim 7.

9. A magneto-resistive memory comprising the SOT device of claim 1.

10. A magnetic sensor comprising the SOT device of claim 1.

11. A spin-orbit torque (SOT) device, comprising:
    a buffer layer comprising Germanium Nickel Iron ($Ge_xNiFe$), the buffer layer having a thickness less than or equal to about 40 Å;
    a bismuth antimony (BiSb) layer disposed over the buffer layer, wherein:
        the BiSb layer is doped and has a (012) crystal orientation, or
        the BiSb layer is undoped and has a (001) crystal orientation; and
    one or more magnetic layers.

12. The SOT device of claim 11, wherein the BiSb layer has a thickness greater than the thickness of the buffer layer.

13. The SOT device of claim 11, further comprising an interlayer disposed over the BiSb layer, the interlayer comprising $Ge_xNiFe$, wherein the interlayer has a thickness less than or equal to about 15 Å.

14. The SOT device of claim 11, wherein the buffer layer comprises a first sublayer of $Ge_xNiFe$, where x is numeral between 44 and 90, and a second sublayer of NiFe, wherein the first sublayer of $Ge_xNiFe$ is disposed in contact with the BiSb layer, and wherein the second sublayer has a thickness less than the first sublayer.

15. A magnetic recording head comprising the SOT device of claim 11.

16. A magnetic recording device comprising the magnetic recording head of claim 15.

17. A magneto-resistive memory comprising the SOT device of claim 11.

18. A magnetic sensor comprising the SOT device of claim 11.

19. A spin-orbit torque (SOT) device, comprising:
    a buffer layer;
    a BiSb layer disposed on the buffer layer, wherein the BiSb layer is doped and has a (012) crystal orientation, or the BiSb layer is undoped and has a (001) crystal orientation;
    an interlayer disposed on the BiSb layer, wherein at least one of the buffer layer and the interlayer comprises Germanium Nickel Iron ($Ge_xNiFe$), where x is numeral between 44 and 90;
    a first barrier layer disposed on the interlayer;
    a ferromagnetic layer disposed on the first barrier layer;
    a second barrier layer disposed on the ferromagnetic layer; and
    a cap layer disposed on the second barrier layer.

20. The SOT device of claim 19, wherein the interlayer comprises $Ge_xNiFe$, the interlayer having a thickness less than or equal to about 15 Å.

21. The SOT device of claim 19, wherein the buffer layer comprises $Ge_xNiFe$, the buffer layer having a thickness less than or equal to about 40 Å.

22. The SOT device of claim 19, wherein the interlayer and the buffer layer each individually comprise $Ge_xNiFe$, and wherein the interlayer and the buffer layer each individually have a smaller thickness than the BiSb layer.

23. A magnetic recording head comprising the SOT device of claim 19.

24. A magnetic recording device comprising the magnetic recording head of claim 23.

25. A magneto-resistive memory comprising the SOT device of claim 19.

26. A magnetic sensor comprising the SOT device of claim 19.

27. A spin-orbit torque (SOT) device, comprising:
a seed layer;
a first barrier layer disposed on the seed layer;
a ferromagnetic layer disposed on the first barrier layer;
a second barrier layer disposed on the ferromagnetic layer;
an interlayer disposed on the second barrier layer;
a BiSb layer disposed on the interlayer, wherein the BiSb layer is doped and has a (012) crystal orientation, or the BiSb layer is undoped and has a (001) crystal orientation; and
a buffer layer disposed on the BiSb layer, wherein at least one of the seed layer, the interlayer, and the buffer layer comprises Germanium Nickel Iron ($Ge_xNiFe$), where x is numeral between 44 and 90.

28. The SOT device of claim 27, wherein the interlayer has a thickness less than or equal to about 15 Å, wherein the buffer layer has a thickness less than or equal to about 40 Å, and wherein the BiSb layer has a thickness greater than the thickness of the buffer layer.

29. The SOT device of claim 27, wherein at least one of the buffer layer and the interlayer comprises $Ge_xNiFe$.

30. The SOT device of claim 27, wherein the first barrier layer and the second barrier layer each individually comprise a high polarization material selected from the group consisting of NiTaN, NiFeTaN, NiWN, NiFeWN, TaN, CrMON, NiCrN, and MgO.

31. A magnetic recording head comprising the SOT device of claim 27.

32. A magnetic recording device comprising the magnetic recording head of claim 31.

33. A magneto-resistive memory comprising the SOT device of claim 27.

34. A magnetic sensor comprising the SOT device of claim 27.

* * * * *